(12) United States Patent
Muzzetto

(10) Patent No.: US 11,355,174 B2
(45) Date of Patent: Jun. 7, 2022

(54) SELF-REFERENCING MEMORY DEVICE

(71) Applicant: Micron Technology, Inc., Boise, ID (US)

(72) Inventor: Riccardo Muzzetto, Arcore (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/507,419

(22) Filed: Jul. 10, 2019

(65) Prior Publication Data

US 2019/0341093 A1 Nov. 7, 2019

Related U.S. Application Data

(62) Division of application No. 15/687,019, filed on Aug. 25, 2017, now Pat. No. 10,395,715.

(51) Int. Cl.
*G11C 11/22* (2006.01)

(52) U.S. Cl.
CPC ........ *G11C 11/2259* (2013.01); *G11C 11/221* (2013.01); *G11C 11/2257* (2013.01); *G11C 11/2273* (2013.01); *G11C 11/2275* (2013.01)

(58) Field of Classification Search
CPC .............. G11C 11/2259; G11C 11/221; G11C 11/2257; G11C 11/2275; G11C 11/2273
USPC ....................................................... 365/145
See application file for complete search history.

(56) References Cited

U.S. PATENT DOCUMENTS

| | | | |
|---|---|---|---|
| 6,317,356 B1 * | 11/2001 | Hoffmann | G11C 11/22 365/145 |
| 6,459,609 B1 * | 10/2002 | Du | G11C 11/22 365/145 |
| 6,819,601 B2 | 11/2004 | Eliason et al. | |
| 7,203,112 B2 | 4/2007 | Liaw | |
| 8,897,088 B2 | 11/2014 | Bartling et al. | |
| 9,042,152 B2 | 5/2015 | Kim et al. | |
| 9,460,785 B2 | 10/2016 | Ogiwara et al. | |

(Continued)

FOREIGN PATENT DOCUMENTS

JP 2006092704 A 4/2006

OTHER PUBLICATIONS

ISA/KR, International Search Report and Written Opinion of the International Searching Authority, Int'l. Appl. No. PCT/US2018/047338, dated Dec. 14, 2018, Korean Intellectual Property Office, Seo-gu, Daejeon, Republic of Korea, 13pgs.

(Continued)

*Primary Examiner* — Alfredo Bermudez Lozada
(74) *Attorney, Agent, or Firm* — Holland & Hart LLP

(57) ABSTRACT

Self-referencing memory device, techniques, and methods are described herein. A self-referencing memory device may include a ferroelectric memory cell. The self-referencing memory device may be configured to determine a logic state stored in a memory cell based on a state signal generated using the ferroelectric memory cell and a reference signal generated using the ferroelectric memory cell. The biasing of the plate line of the ferroelectric memory cell may be used to generate the voltage need to generate the state signal during a first time period of an access operation and to generate the reference signal during a second time period of the access operation. Procedures and operations related to a self-referencing memory device are described.

20 Claims, 11 Drawing Sheets

(56) References Cited

U.S. PATENT DOCUMENTS

| | | |
|---|---|---|
| 9,734,886 B1 | 8/2017 | Derner et al. |
| 2005/0201137 A1* | 9/2005 | Mukaiyama ............ G11C 11/22 365/145 |
| 2006/0067138 A1* | 3/2006 | Ogiwara ................ G11C 11/22 365/189.09 |

OTHER PUBLICATIONS

Japan Patent Office, "Notice of Rejection Ground," issued in connection with Japanese Patent Application No. 2020-510586, dated Mar. 9, 2021 (8 pages).

European Patent Office, "Extended Search Report," issued in connection with European Patent Application No. 18848866.2, dated Apr. 14, 2021 (9 pages).

Yamada, Junichi et al, "A Self-Reference Read Scheme for a 1T/1C FeRAM," 1998 Symposium on VLSI Circuits, Digest of Technical Papers, Jun. 11-13, 1998 (4 pages).

Korean Intellectual Property Office, "Notice of Reasons for Rejection," issued in connection with Korean Patent Application No. 10-2020-7007511, dated Apr. 8, 2021 (6 pages).

* cited by examiner

SELF-REFERENCING MEMORY DEVICE

CROSS REFERENCE

The present Application for Patent is a divisional of U.S. patent application Ser. No. 15/687,019 by Muzzetto, entitled "Self-Referencing Memory Device," filed Aug. 25, 2017, assigned to the assignee hereof, and is expressly incorporated by reference in its entirety herein.

BACKGROUND

The following relates generally to memory devices and more specifically to a self-referencing memory device.

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. FeRAM may use similar device architectures as volatile memory but may have non-volatile properties due to the use of a ferroelectric capacitor as a storage device. FeRAM devices may thus have improved performance compared to other non-volatile and volatile memory devices.

Improving memory devices, generally, may include increasing memory cell density, increasing read/write speeds, increasing reliability, increasing data retention, reducing power consumption, or reducing manufacturing costs, among other metrics.

DETAILED DESCRIPTION

Over time one or more characteristics of a memory cell may degrade. For example, a ferroelectric memory cell may experience degradation by depolarization, fatigue, imprint, other forms of degradation, or a combination thereof. Degradation of the memory cell may increase a number of errors introduced during various access operations because the actual characteristic (e.g., the degraded characteristic) may be different from an expected characteristic of the memory cell. Self-referencing memory cells may mitigate some errors that may be introduced by degradation of the memory cell.

A self-referencing memory device and related methods and techniques are described herein. The self-referencing memory device may include a ferroelectric memory cell. The self-referencing memory cell may be configured to determine a logic state stored a memory cell based on a state signal generated using the ferroelectric memory cell and a reference signal generated using the ferroelectric memory cell. The biasing of the plate line of the ferroelectric memory cell may be used to generate the voltage need to generate the state signal during a first time period of a read operation and the reference signal during a second time period of the read operation. A memory controller may execute various procedures and commands during the read operation to generate the state signal and the reference signal. Such procedures and commands may include activating and/or deactivating switching components, driving inputs high or low, other operations, or a combination thereof.

Features of the disclosure introduced above are further described below in the context of a memory device and a memory circuit. These and other features of the disclosure are further illustrated by and described with reference to apparatus diagrams, system diagrams, and flowcharts that relate to a self-referencing memory device.

Figure 1:
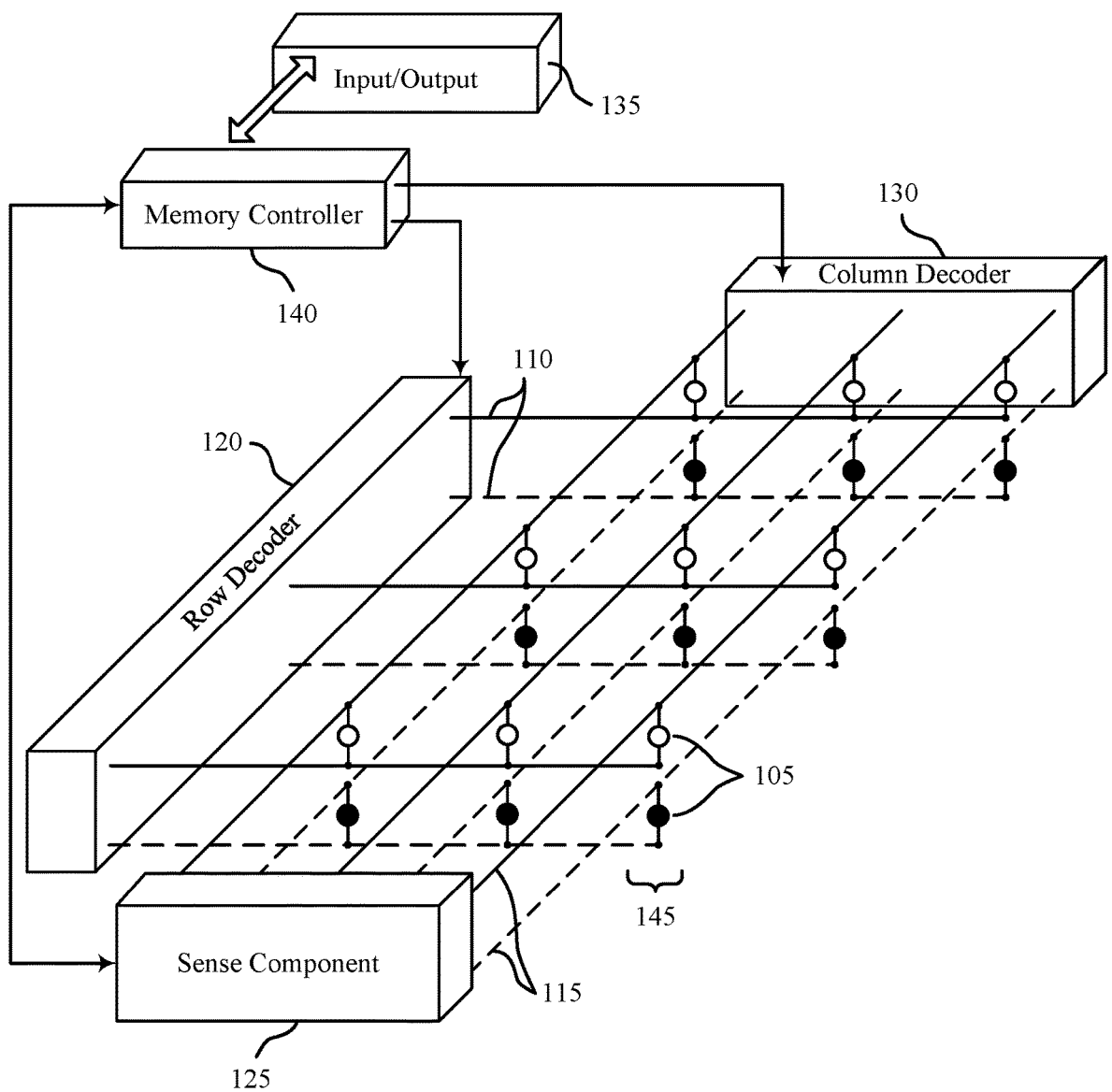
FIG. 1 illustrates an example of a memory device that supports a self-referencing memory device in accordance with embodiments of the present disclosure.

FIG. 1 illustrates an example memory device 100 in accordance with various embodiments of the present disclosure. Memory device 100 may also be referred to as an electronic memory apparatus. Memory device 100 includes memory cells 105 that are programmable to store different states. Each memory cell 105 may be programmable to store two states, denoted as a logic 0 and a logic 1. In some cases, memory cell 105 is configured to store more than two logic states. A memory cell 105 may store a charge representative of the programmable states in a capacitor; for example, a charged and uncharged capacitor may represent two logic states, respectively. DRAM architectures may commonly use such a design, and the capacitor employed may include a dielectric material with linear or para-electric electric polarization properties as the insulator. By contrast, a ferroelectric memory cell may include a capacitor with a ferroelectric as the insulating material. Different levels of charge of a ferroelectric capacitor may represent different logic states. Ferroelectric materials have non-linear polarization properties; some details and advantages of a ferroelectric memory cell 105 are discussed below.

Operations such as reading and writing may be performed on memory cells 105 by activating or selecting access line 110 and digit line 115. Access lines 110 may also be known as word lines 110, and bit lines 115 may also be known as digit lines 115. References to word lines and bit lines, or their analogues, are interchangeable without loss of understanding or operation. Activating or selecting a word line 110 or a digit line 115 may include applying a voltage to the respective line. Word lines 110 and digit lines 115 may be made of conductive materials such as metals (e.g., copper (Cu), aluminum (Al), gold (Au), tungsten (W), etc.), metal alloys, carbon, conductively-doped semiconductors, or other conductive materials, alloys, compounds, or the like.

According to the example of FIG. 1, each row of memory cells 105 is connected to a single word line 110, and each column of memory cells 105 is connected to a single digit line 115. By activating one word line 110 and one digit line 115 (e.g., applying a voltage to the word line 110 or digit line 115), a single memory cell 105 may be accessed at their intersection. Accessing the memory cell 105 may include reading or writing the memory cell 105.

Memory device 100 may be a two-dimensional (2D) memory array or a three-dimensional (3D) memory array. A 3D memory array may include two-dimensional (2D) memory arrays formed on top of one another. This may increase the number of memory cells that may be placed or created on a single die or substrate as compared with 2D arrays, which in turn may reduce production costs or increase the performance of the memory array, or both. Memory device 100 may include any number of levels. Each level may be aligned or positioned so that memory cells 105 may be approximately aligned with one another across each level.

Each row of memory cells 105 may be connected to a single word line 110, and each column of memory cells 105 may be connected to a single digit line 115. In the example depicted in FIG. 1, memory device 100 includes one/two level/levels of memory cells 105 and may thus be considered a two-dimensional/three-dimensional memory array; however, the number of levels is not limited. By activating one word line 110 and one digit line 115 (e.g., applying a voltage to the word line 110 or digit line 115), a single memory cell 105 may be accessed at their intersection. Additionally, for example, in a 3D memory array, each level in a row may have common conductive lines such that each level may share the word lines 110 or digit lines 115 or contain separate word lines 110 or digit lines 115. Thus in a 3D configuration, one word line 110 and one digit line 115 of a same level may be activated to access a single memory cell 105 at their intersection. The intersection of a word line 110 and digit line 115, in either a 2D or 3D configuration, may be referred to as an address of a memory cell. In some examples, the memory device 100 may be a self-referencing memory device where the reference signal is developed using the memory cell rather than some other component. As such, operations of a ferroelectric memory device may be altered to account for the self-referencing portions of the memory device.

In some architectures, the logic storing device of a cell, e.g., a capacitor, may be electrically isolated from the digit line by a selection component. The word line 110 may be connected to and may control the selection component. For example, the selection component may be a transistor and the word line 110 may be connected to the gate of the transistor. Activating the word line 110 results in an electrical connection or closed circuit between the capacitor of a memory cell 105 and its corresponding digit line 115. The digit line may then be accessed to either read or write the memory cell 105. Other lines (not shown in FIG. 1) may be present. For example, plate lines, described in more detail with reference to at least FIG. 2, may be coupled to the memory cells 105.

Accessing the memory cells 105 may be controlled through a row decoder 120, a column decoder 130 and/or, in some cases, a plate line decoder (not shown). For example, a row decoder 120 may receive a row address from the memory controller 140 and activate the appropriate word line 110 based on the received row address. Similarly, a column decoder 130 receives a column address from the memory controller 140 and activates the appropriate digit line 115. For example, memory device 100 may include multiple word lines 110, labeled WL_1 through WL_M, and multiple digit lines 115, labeled DL_1 through DL_N, where M and N depend on the array size. Thus, by activating a word line 110 and a digit line 115, e.g., WL_2 and DL_3, the memory cell 105 at their intersection may be accessed.

Upon accessing, a memory cell 105 may be read, or sensed, by sense component 125 to determine the stored state of the memory cell 105. For example, after accessing the memory cell 105, the ferroelectric capacitor of memory cell 105 may discharge onto its corresponding digit line 115. Discharging the ferroelectric capacitor may result from biasing, or applying a voltage, to the ferroelectric capacitor. The discharging may cause a change in the voltage of the digit line 115, which sense component 125 may compare to a reference voltage (not shown) in order to determine the stored state of the memory cell 105. For example, if digit line 115 has a higher voltage than the reference voltage, then sense component 125 may determine that the stored state in memory cell 105 was a logic 1 and vice versa. Sense component 125 may include various transistors or amplifiers in order to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120. In some examples, the read logic state may be determined by comparing a state signal from the memory cell 105 to a reference signal generated from the memory cell 105 as well. Such operations may be performed by or related to a self-referencing memory device.

A memory cell 105 may be set, or written, by similarly activating the relevant word line 110 and digit line 115—i.e., a logic value may be stored in the memory cell 105. Column decoder 130 or row decoder 120 may accept data, for example input/output 135, to be written to the memory cells 105. A ferroelectric memory cell 105 may be written by applying a voltage across the ferroelectric capacitor. This process is discussed in more detail below.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, activating a single word line 110 may result in the discharge of all memory cells in the row; thus, several or all memory cells 105 in the row may need to be re-written.

Some memory architectures, including DRAM, may lose their stored state over time unless they are periodically refreshed by an external power source. For example, a charged capacitor may discharge over time through leakage currents, resulting in the loss of the stored information. The refresh rate of these so-called volatile memory devices may be relatively high, e.g., tens of refresh operations per second for DRAM arrays, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, ferroelectric memory cells 105 may have beneficial properties that may result in improved performance relative to other memory architectures.

The memory controller 140 may control the operation (e.g., read, write, re-write, refresh, discharge, etc.) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and digit line 115. Memory controller 140 may also generate and control various voltages or currents used during the operation of memory device 100. For example, it may apply discharge voltages to a word line 110 or digit line 115 after accessing one or more memory cells 105. In general, the amplitude, shape, or duration of an applied voltage or current discussed herein may be adjusted or varied and may be different for the various operations discussed in operating the memory device 100. Furthermore, one, multiple, or all memory cells 105 within memory device 100 may be accessed simultaneously; for example, multiple or all cells of memory device 100 may be accessed simultaneously during a reset operation in which all memory cells 105, or a group of memory cells 105, are set to a single logic state. In some examples, the memory controller 140 may be include commands and procedures to perform access operations using the self-referencing aspects and components of a self-referencing ferroelectric memory device.

Figure 2:
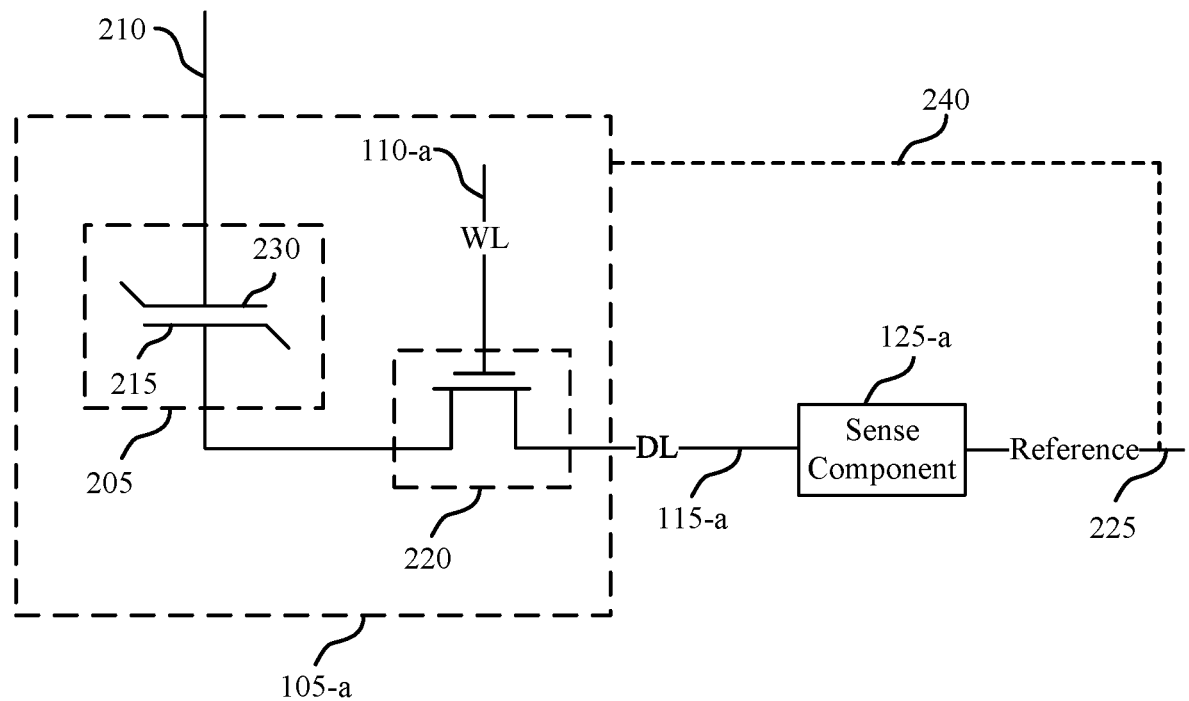
FIG. 2 illustrates an example of a circuit that supports a self-referencing memory device in accordance with embodiments of the present disclosure.

FIG. 2 illustrates an example circuit 200 in accordance with various embodiments of the present disclosure. Circuit 200 includes a memory cell 105-a, word line 110-a, digit line 115-a, and sense component 125-a, which may be examples of a memory cell 105, word line 110, digit line 115, and sense component 125, respectively, as described with reference to FIG. 1. Memory cell 105-a may include a logic storage component, such as capacitor 205 that has a first plate, cell plate 230, and a second plate, cell bottom 215. Cell plate 230 and cell bottom 215 may be capacitively coupled through a ferroelectric material positioned between them. The orientation of cell plate 230 and cell bottom 215 may be flipped without changing the operation of memory cell 105-a. Circuit 200 also includes selection component 220 and reference line 225. Cell plate 230 may be accessed via plate line 210 and cell bottom 215 may be accessed via digit line 115-a. As described above, various states may be stored by charging or discharging the capacitor 205. In some cases, the reference signal on the reference line 225 may be developed using the memory cell 105-a. In such cases, the memory cell 105-a may be coupled with the reference line 225 using, for example, line 240. In some instances, a reference signal circuit may be configured to generate the reference signal based on the memory cell 105-a. In such configurations, a state signal circuit may be configured to generate the state signal using the memory cell 105-a during a first time period so that the reference signal may be generated using the memory cell 105-a during a second time period of the access operation.

The stored state of capacitor 205 may be read or sensed by operating various elements represented in circuit 200. Capacitor 205 may be in electronic communication with digit line 115-a. For example, capacitor 205 can be isolated from digit line 115-a when selection component 220 is deactivated, and capacitor 205 can be connected to digit line 115-a when selection component 220 is activated. Activating selection component 220 may be referred to as selecting memory cell 105-a. In some cases, selection component 220 is a transistor and its operation is controlled by applying a voltage to the transistor gate, where the voltage magnitude is greater than the threshold magnitude of the transistor. Word line 110-a may activate the selection component 220; for example, a voltage applied to word line 110-a is applied to the transistor gate, connecting the capacitor 205 with digit line 115-a. In some cases, the reference signal for a ferroelectric memory cell may be generated using the memory cell 105-a. In such cases, the operation of the circuit 200 may be modified during a sense scheme to account for the development of the reference signal. Using a self-referencing memory cell may, in some embodiments, reduce errors due to degradation of the memory cell 105-a.

In other examples, the positions of selection component 220 and capacitor 205 may be switched, such that selection component 220 is connected between plate line 210 and cell plate 230 and such that capacitor 205 is between digit line 115-a and the other terminal of selection component 220. In this embodiment, selection component 220 may remain in electronic communication with digit line 115-a through capacitor 205. This configuration may be associated with alternative timing and biasing for read and write operations.

Due to the ferroelectric material between the plates of capacitor 205, and as discussed in more detail below, capacitor 205 may not discharge upon connection to digit line 115-a. In one scheme, to sense the logic state stored by a ferroelectric capacitor, the word line 110-a may be biased to select memory cell 105-a and a voltage may be applied to plate line 210. In some cases, digit line 115-a is virtually grounded and then isolated from the virtual ground, which may be referred to as "floating," prior to biasing the plate line 210 and word line 110-a. Biasing the plate line 210 may result in a voltage difference (e.g., plate line 210 voltage minus digit line 115-a voltage) across capacitor 205. The voltage difference may yield a change in the stored charge on capacitor 205, where the magnitude of the change in stored charge may depend on the initial state of capacitor 205—e.g., whether the initial state stored a logic 1 or a logic 0. This may cause a change in the voltage of digit line 115-a based on the charge stored on capacitor 205. Operation of memory cell 105-a by varying the voltage to cell plate 230 may be referred to as "moving cell plate."

The change in voltage of digit line 115-a may depend on its intrinsic capacitance. That is, as charge flows through digit line 115-a, some finite charge may be stored in digit line 115-a and the resulting voltage depends on the intrinsic capacitance. The intrinsic capacitance may depend on physical characteristics, including the dimensions, of digit line 115-a. Digit line 115-a may connect many memory cells 105 so digit line 115-a may have a length that results in a non-negligible capacitance (e.g., on the order of picofarads (pF)). The resulting voltage of digit line 115-a may then be compared to a reference signal (e.g., a voltage of reference line 225) by sense component 125-a in order to determine the stored logic state in memory cell 105-a. Other sensing processes may be used. In some cases, the reference signal may be developed using the memory cell 105-a.

Sense component 125-a may include various transistors or amplifiers to detect and amplify a difference in signals, which may be referred to as latching. Sense component 125-a may include a sense amplifier that receives and compares the voltage of digit line 115-a and reference line 225, which may be a reference voltage. The sense amplifier output may be driven to the higher (e.g., a positive) or lower (e.g., negative or ground) supply voltage based on the comparison. For instance, if digit line 115-a has a higher voltage than reference line 225, then the sense amplifier output may be driven to a positive supply voltage. In some cases, the sense amplifier may additionally drive the digit line 115-a to the supply voltage. Sense component 125-a may then latch the output of the sense amplifier and/or the voltage of digit line 115-a, which may be used to determine the stored state in memory cell 105-a, e.g., logic 1. Alternatively, if digit line 115-a has a lower voltage than reference line 225, the sense amplifier output may be driven to a negative or ground voltage. Sense component 125-a may similarly latch the sense amplifier output to determine the stored state in memory cell 105-a, e.g., logic 0. The latched logic state of memory cell 105-a may then be output, for example, through column decoder 130 as output 135 with reference to FIG. 1.

To write memory cell 105-a, a voltage may be applied across capacitor 205. Various methods may be used. In one example, selection component 220 may be activated through word line 110-a in order to electrically connect capacitor 205 to digit line 115-a. A voltage may be applied across capacitor 205 by controlling the voltage of cell plate 230 (through plate line 210) and cell bottom 215 (through digit line 115-a). To write a logic 0, cell plate 230 may be taken high, that is, a positive voltage may be applied to plate line 210, and cell bottom 215 may be taken low, e.g., virtually grounding or applying a negative voltage to digit line 115-a. The opposite process is performed to write a logic 1, where cell plate 230 is taken low and cell bottom 215 is taken high.

Figure 3:
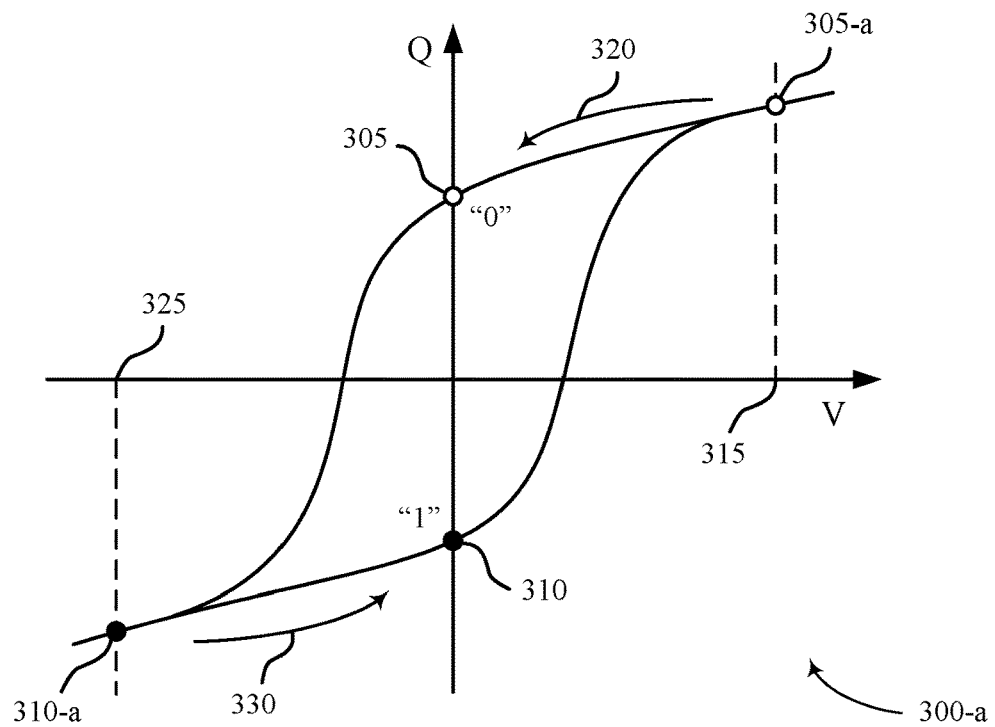
FIG. 3 illustrates an example of hysteresis curves that relate to a self-referencing memory device in accordance with embodiments of the present disclosure.
Figure 3:
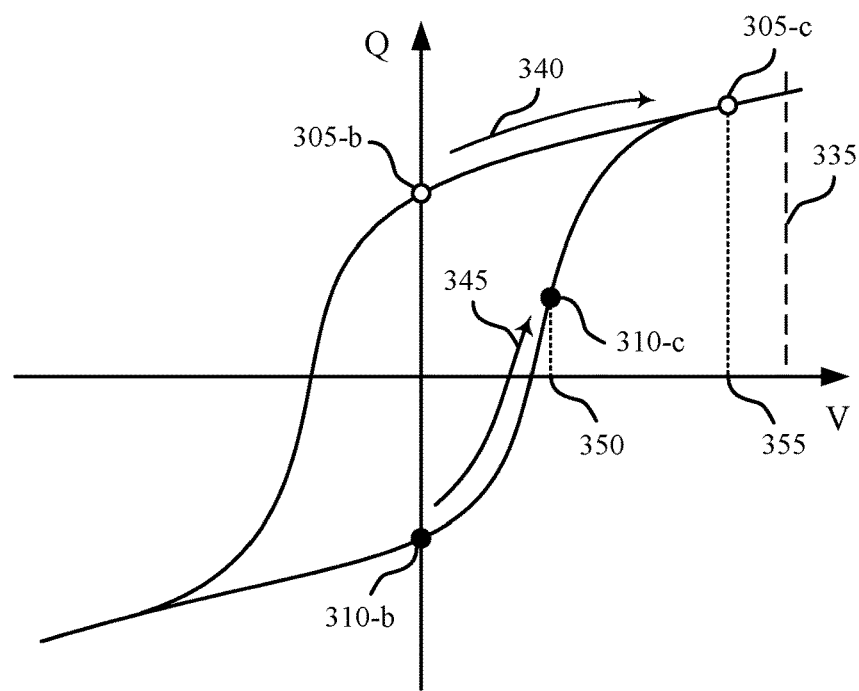

FIG. 3 illustrates an example of non-linear electrical properties with hysteresis curves 300-a and 300-b for a ferroelectric memory cell that is operated in accordance with various embodiments of the present disclosure. Hysteresis curves 300-a and 300-b illustrate an example ferroelectric memory cell writing and reading process, respectively. Hysteresis curves 300-a and 300-b depict the charge, Q, stored on a ferroelectric capacitor (e.g., capacitor 205 of FIG. 2) as a function of a voltage difference, V. The hysteresis curves 300-a and 300-b illustrates aspects related to an example ferroelectric memory cell that may degrade in some manner and related to self-reference devices, techniques, and methods to counter the effects of degradation and other problems.

A ferroelectric material is characterized by a spontaneous electric polarization, i.e., it maintains a non-zero electric polarization in the absence of an electric field. Example ferroelectric materials include barium titanate (BaTiO3), lead titanate (PbTiO3), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

Hysteresis curves 300-a and 300-b may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, it should be understood that the voltages in hysteresis curves 300-a and 300-b represent a voltage difference across the capacitor and are directional. For example, a positive voltage may be realized by applying a positive voltage to the terminal in question (e.g., a cell plate 230) and maintaining the second terminal (e.g., a cell bottom 215) at ground (or approximately zero volts (0V)). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300-a and 300-b.

As depicted in hysteresis curve 300-a, the ferroelectric material may maintain a positive or negative polarization with a zero voltage difference, resulting in two possible charged states: charge state 305 and charge state 310. According to the example of FIG. 3, charge state 305 represents a logic 0 and charge state 310 represents a logic 1. In some examples, the logic values of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-a is reached. Upon removing voltage 315, charge state 305-a follows path 320 until it reaches charge state 305 at zero voltage. Similarly, charge state 310 is written by applying a net negative voltage 325, which results in charge state 310-a. After removing negative voltage 325, charge state 310-a follows path 330 until it reaches charge state 310 at zero voltage. Charge states 305-a and 310-a may also be referred to as the remnant polarization (Pr) values, i.e., the polarization (or charge) that remains upon removing the external bias (e.g., voltage). The coercive voltage is the voltage at which the charge (or polarization) is zero. Polarization values of charge states may vary over time due to degradation of the memory cell. Degradation may increase a number of errors introduced into data stored by the memory cells.

To read, or sense, the stored state of the ferroelectric capacitor, a voltage may be applied across the capacitor. In response, the stored charge, Q, changes, and the degree of the change depends on the initial charge state—i.e., the final stored charge (Q) depends on whether charge state 305-b or 310-b was initially stored. For example, hysteresis curve 300-*b* illustrates two possible stored charge states 305-*b* and 310-*b*. Voltage 335 may be applied across the capacitor as discussed with reference to FIG. 2. In other cases, a fixed voltage may be applied to the cell plate and, although depicted as a positive voltage, voltage 335 may be negative. In response to voltage 335, charge state 305-*b* may follow path 340. Likewise, if charge state 310-*b* was initially stored, then it follows path 345. The final position of charge state 305-*c* and charge state 310-*c* depend on a number of factors, including the specific sensing scheme and circuitry.

In some cases, the final charge may depend on the intrinsic capacitance of the digit line connected to the memory cell. For example, if the capacitor is electrically connected to the digit line and voltage 335 is applied, the voltage of the digit line may rise due to its intrinsic capacitance. So a voltage measured at a sense component may not equal voltage 335 and instead may depend on the voltage of the digit line. The position of final charge states 305-*c* and 310-*c* on hysteresis curve 300-*b* may thus depend on the capacitance of the digit line and may be determined through a load-line analysis—i.e., charge states 305-*c* and 310-*c* may be defined with respect to the digit line capacitance. As a result, the voltage of the capacitor, voltage 350 or voltage 355, may be different and may depend on the initial state of the capacitor.

By comparing the digit line voltage to a reference voltage, the initial state of the capacitor may be determined. The digit line voltage may be the difference between voltage 335 and the final voltage across the capacitor, voltage 350 or voltage 355—i.e., (voltage 335—voltage 350) or (voltage 335—voltage 355). A reference voltage may be generated such that its magnitude is between the two possible voltages of the two possible digit line voltages in order to determine the stored logic state—i.e., if the digit line voltage is higher or lower than the reference voltage. For example, the reference voltage may be an average of the two quantities, (voltage 335—voltage 350) and (voltage 335—voltage 355). Upon comparison by the sense component, the sensed digit line voltage may be determined to be higher or lower than the reference voltage, and the stored logic value of the ferroelectric memory cell (i.e., a logic 0 or 1) may be determined.

As discussed above, reading a memory cell that does not use a ferroelectric capacitor may degrade or destroy the stored logic state. A ferroelectric memory cell, however, may maintain the initial logic state after a read operation. For example, if charge state 305-*b* is stored, the charge state may follow path 340 to charge state 305-*c* during a read operation and, after removing voltage 335, the charge state may return to initial charge state 305-*b* by following path 340 in the opposite direction.

Hysteresis curve 300-*b* illustrates an example of reading of stored charge states 305 *a* and 310-*a*. A read voltage 335 may be applied, for example, as a voltage difference via a digit line 115 and a plate line 215 as described with reference to FIG. 2. Hysteresis curve 300-*b* may illustrate read operations where the read voltage 335 is negative voltage difference Vcap (e.g., where Vbottom—Vplate is negative). A negative read voltage across the capacitor may be referred to as a "plate high" read operation, where a plate line 215 is taken initially to a high voltage, and a digit line 115 is initially at a low voltage (e.g., a ground voltage). Although read voltage 335 is shown as a negative voltage across the ferroelectric capacitor 205, in alternative operations a read voltage may be a positive voltage across the ferroelectric capacitor 205, which may be referred to as a "plate low" read operation.

The read voltage 335 may be applied across the ferroelectric capacitor 205 when a memory cell 105 is selected (e.g., by activating a selection component 250 as described with reference to FIG. 2). Upon applying the read voltage 335 to the ferroelectric capacitor 205, charge may flow into or out of the ferroelectric capacitor 205 via the digit line 115 and plate line 215, and different charge states may result depending on whether the ferroelectric capacitor 205 was at charge state 305-*a* (e.g., a logic 1) or at charge state 310-*a* (e.g., a logic 0). As described more with reference to FIG. 4, various properties and other operations associated with example hysteresis curves relate to various embodiments of a self-referencing memory device and methods and techniques.

Figure 4:
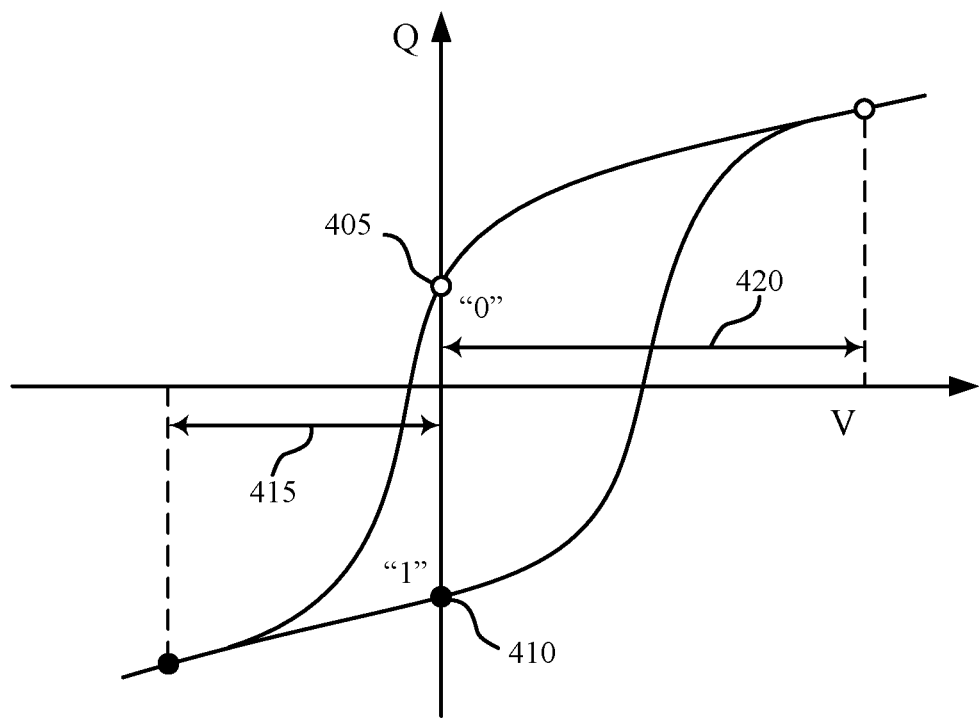
FIG. 4 illustrates an example of a hysteresis curve that relates to a self-referencing memory device in accordance with embodiments of the present disclosure.

FIG. 4 illustrates an example of a hysteresis curve 400 that relates to a self-referencing memory device in accordance with various embodiments of the present disclosure. The hysteresis curve 400 illustrates aspects related to an example ferroelectric memory cell that has degraded in some manner (e.g., degradation by imprint). The hysteresis curve 400 depicts the charge, Q, stored on a ferroelectric capacitor (e.g., capacitor 205 of FIG. 2) as a function of a voltage difference, V. The hysteresis curve 400 may be an example of the hysteresis curves 300-*a* and 300-*b* described with reference to FIG. 3.

Over time, a ferroelectric memory cell may degrade. The types of degradation and severity of the degradation may determine a lifespan of the ferroelectric memory cell. Types of degradation may include depolarization, imprint, and other types. Degradation by depolarization relates to a situation where the level of polarization of each charge state 405, 410 is lessened. Such degradation by depolarization may be represented on a hysteresis curve by one or more charge states 405, 410 being positioned closer to the zero charge state.

Degradation by imprint relates to a situation where the ferroelectric capacitor in the ferroelectric memory cell may become resistive to a reversal in polarization. In such situations, it may be easier to polarize the ferroelectric memory cell to one charge state (e.g., charge state 410) than it is to polarize the ferroelectric memory cell to another charge state (e.g., charge state 405). Such a degradation by imprint may be represented on a hysteresis curve by a leftward shift or a rightward shift of the hysteresis curve.

For example, hysteresis curve 400 shows degradation by imprint with a rightward shift of the hysteresis curve. In such examples, repeated storage of the charge state 410 may cause the ferroelectric capacitor to be "imprinted" with the charge state 410. As such, the amount of voltage 415 needed to polarize the ferroelectric capacitor to charge state 410 may be less than the amount of voltage 420 needed to polarize the ferroelectric capacitor to charge state 405. Degradation by imprint may cause it to be more difficult to read or write data to the charge state 405. Techniques and embodiments are provided herein for a self-referencing ferroelectric memory cell that compensates for various types of degradation.

Figure 5:
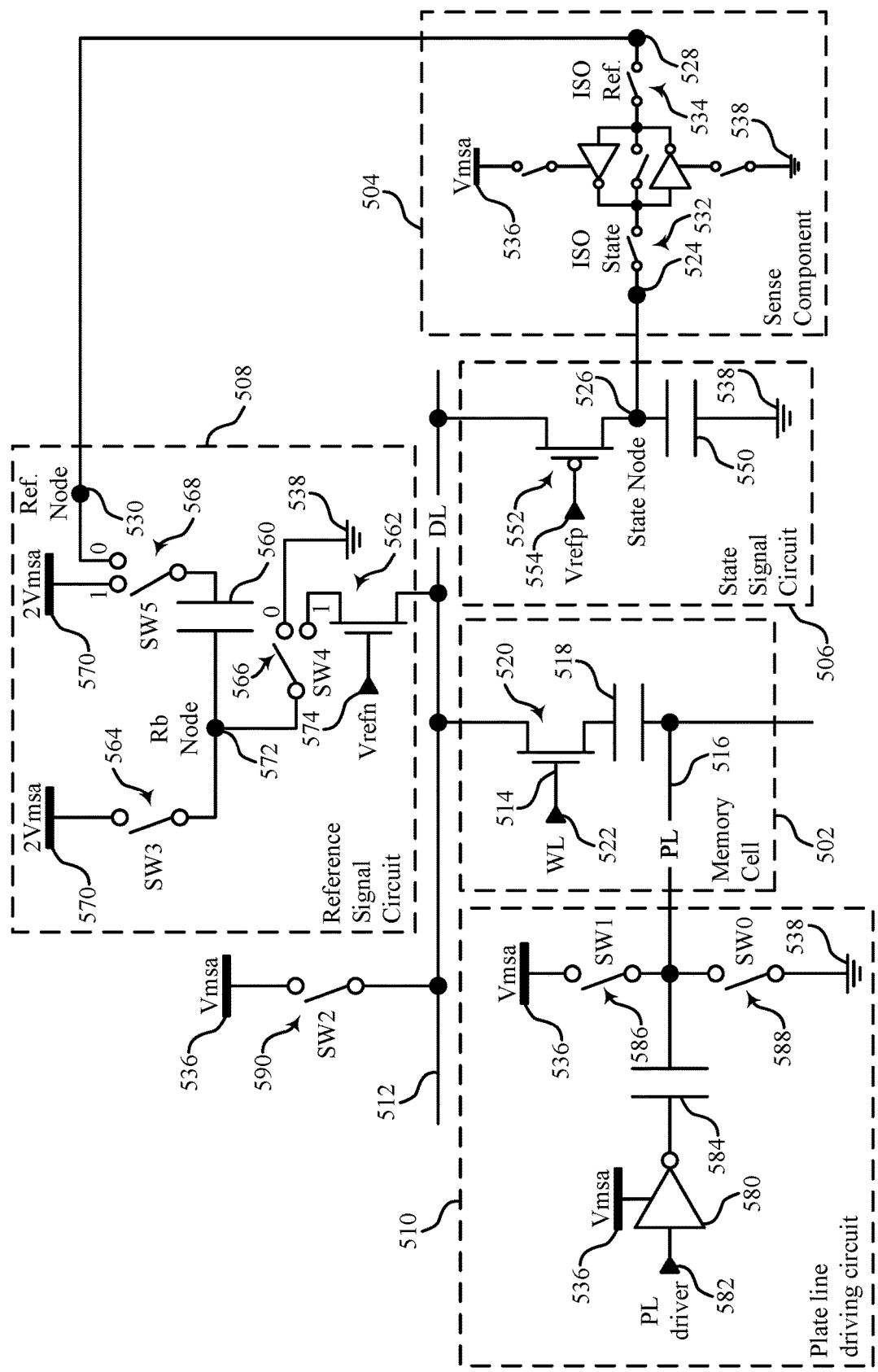
FIG. 5 illustrates an example of a memory circuit that supports a self-referencing memory device in accordance with embodiments of the present disclosure.

FIG. 5 illustrates an example of a memory circuit 500 that supports a self-referencing memory device in accordance with various embodiments of the present disclosure. The memory circuit 500 may be an example of the memory device 100 described with reference to FIGS. 1 and 2.

The memory circuit 500 may be an example of a self-referencing ferroelectric memory device. In some memory devices, a sense component (e.g., sense component 125) may determine a logic state stored in a memory cell by comparing a signal representative of a charge stored in the memory cell's capacitor to a reference signal. In self-referencing memory devices, the reference signal may be generated using the memory cell. In other memory devices, the reference signal may be generated using a component different from the memory cell.

If the memory cell degrades (e.g., by depolarization or imprint), the signal that represents a charge stored in a memory cell capacitor may change relative to the reference signal. If this occurs, read and write errors may increase because the expected sense window may change.

In some self-referencing memory devices, because the reference signal is generated based on the memory cell, the reference signal and the state signal will change as the characteristics of the memory cell change, sometimes due to degradation. As such, as characteristics of the memory device change over time (e.g., due to degradation), a self-referencing cell may experience fewer errors than an independently referenced cell because the state signal and the reference signal vary as the memory cell ages (e.g., degradation by imprint will affect both signals).

The memory circuit 500 may be an example of a self-referencing ferroelectric memory device that extracts 2Pr from the memory cell during an access operation. The memory circuit 500 illustrates, among other aspects, components used in access operations (e.g., read operations, write operations).

The memory circuit 500 may include a memory cell 502, a sense component 504, a state signal circuit 506, a reference signal circuit 508, and a plate line driving circuit 510. The various components of the memory circuit 500 may be configured to determine a logic state stored in the memory cell 502 based on a state signal generated during a first time period of an access operation and a reference signal generated during a second time period of the access operation. In some examples, the memory circuit 500 may be configured to determine a logic state based on a charge extracted from a ferroelectric capacitor by a state signal circuit 506, a reference signal generated by a reference signal circuit 508, or both.

The memory circuit 500 may also include a digit line 512, a word line 514, and a plate line 516. The memory cell 502 may be coupled with the digit line 512, the word line 514, and/or the plate line 516. The memory cell 502 may include a cell capacitor 518 and a selection component 520. The cell capacitor 518 may be configured to store a charge representative of a logic state. The cell capacitor 518 may be an example the capacitor 205 described with reference to FIG. 2. The memory cell 502 may be part of an array of memory cells (not shown).

The selection component 520 may be configured to selectively couple the cell capacitor 518 with the digit line 512 based on a word line signal 522 communicated by a memory controller using the word line 514. The selection component 520 may be an example of a switching component such as a transistor (e.g., n-type, p-type). The word line 514 may be coupled with a gate of the selection component 520. When the selection component 520 is activated, voltage differences between the digit line 512 and the plate line 516 may cause a logic state to be read from the cell capacitor 518, a logic state to be written to the cell capacitor 518, the cell capacitor 518 to be precharged, or a combination thereof. The selection component 520 may be an example of the selection component 220 described with reference to FIG. 2.

The sense component 504 may be configured to determine the stored state of the memory cell 502. In some embodiments, the sense component 504 may determine the stored state of the memory cell 502 by comparing a state signal indicative of the charge stored on the memory cell 502 to a reference signal. If the state signal is greater than the reference signal, the sense component 504 may determine that a first logic state is stored on the memory cell 502. If the state signal is less than the reference signal, the sense component 504 may determine that a second logic state different from the first logic state is stored on the memory cell 502. The sense component 504 may be an example of the sense component 125 described with reference to FIGS. 1 and 2.

The sense component 504 may include a first node 524 coupled with a state node 526 associated with the memory cell 502 and a second node 528 coupled with a reference node 530 associated with the memory cell 502. The sense component 504 may include a first isolation switching component 532 and a second isolation switching component 534 to selective isolate the sense component from the state node 526 and/or the reference node 530. The switching components 532, 534 may be examples of a transistor or other type of electronic switch that selectively establishes an electrical connection between two components. The sense component 504 may be selectively coupled with a voltage source 536 (e.g., Vmsa, Vdd, Vcc) and/or a ground 538. The ground 538 may, in some embodiments, be an example of a virtual ground (e.g., Vss, Vee). In some cases, the first node 524 may be coupled to the digit line 512. In some cases, the first node 524 may be coupled to the state signal circuit 506.

The state signal circuit 506 may be configured to extract a charge indicative of a logic state from the memory cell 502 during a first time period of a read operation. The state signal circuit 506 may include a charge capacitor 550, the state node 526, and a switching component 552.

During a read operation, at least a portion of the charge stored on the memory cell 502 may be transferred to a charge capacitor 550. In some examples, some of the charge stored on the memory cell 502 is transferred to the charge capacitor 550 and some to the reference capacitor 560. In some examples, the amount of charge transferred from the memory cell 502 to the charge capacitor 550 is sufficient to distinguish between logic states. In some examples, all of the charge of the memory cell 502 is transferred to the charge capacitor 550. The sense component 504 may be coupled with the state node 526. As such, the state signal circuit 506 may send a state signal to the sense component 504 using the charge capacitor 550. The charge capacitor 550 may include a first capacitor value (e.g., in Farads). The charge capacitor 550 may be coupled with ground 538.

The state signal circuit 506 may be selectively coupled with the digit line 512 by the switching component 552. The switching component 552 may be controlled by a gate signal 554 (e.g., Vrefp) received from a memory controller (e.g., memory controller 140). In some embodiments, the switching component 552 may be an example of a cascode. In some embodiments, the switching component 552 may be an example of a p-type transistor. In some embodiments, the switching component 552 may be a transistor type that is different from a transistor type that selectively couples the reference signal circuit 508 to the digit line 512.

The reference signal circuit 508 may be configured to extract a charge indicative of a reference signal from the memory cell 502 during a second time period of a read operation. In some cases, the second time period may occur after the first time period for extracting the charge indicative of the logic state in the read operation. The reference signal circuit 508 may include a reference capacitor 560, a first switching component 562 to selectively coupled the reference signal circuit 508 to the digit line 512, as second switching component 564, a first two-path switch 566, a second two-path switch 568, a voltage source 570, a reference node 530, and/or an Rb node 572.

During a read operation, the memory cell 502 may be used to generate a reference signal on the reference capacitor 560. The sense component 504 may be coupled with the reference node 530. As such, the reference signal circuit 508 may send a reference signal to the sense component 504 using the reference capacitor 560. The reference capacitor 560 may include a second capacitor value (e.g., in Farads) different from the first capacitor value of the charge capacitor 550. In some cases, the second capacitor value may be greater than the first capacitor value. In some cases, the second capacitor value may be double the first capacitor value. In some cases, the second capacitor value may be some integer multiple greater than the first capacitor value. In some cases, the second capacitor value may be less than the first capacitor value.

The reference signal circuit 508 may be selectively coupled with the digit line 512 by the first switching component 562. The first switching component 562 may be controlled by a gate signal 574 (e.g., Vrefn) received from a memory controller (e.g., memory controller 140). In some examples, the first switching component 562 may be an example of a cascode. In some examples, the first switching component 562 may be an example of a n-type transistor. In some examples, the first switching component 562 may be transistor type that is opposite from a transistor type of the switching component 552 of the state signal circuit 506. In some cases, the gate signal 574 may be a complement of the gate signal 554 for the state signal circuit 506. In some cases, the first switching component 562 may be a p-type transistor and the switching component 552 may be a n-type transistor.

The second switching component 564 may be configured to selectively couple the Rb node 572 with the voltage source 570. The second switching component 564 may be an example of any type of switching component, transistor, or combination thereof that can selectively couple two electrical paths together. The second switching component 564 may be controlled by a command signal (e.g., signal SW3) received from a memory controller (e.g., memory controller 140). In some cases, the voltage source 570 may be greater than the voltage source 536. For example, the voltage source 570 may be double the value of the voltage source 536 (e.g., 2Vmsa, 2Vdd, 2Vee).

The first two-path switch 566 may be configured to selectively couple the Rb node 572 with either ground 538 or with the first switching component 562. For example, in some cases, if a command signal (e.g., signal SW4) to the first two-path switch 566 (e.g., from the memory controller 140) indicates a first value (e.g., a low value, a value represented by a logic '0'), the first two-path switch 566 may couple the Rb node 572 with ground 538. If a command signal (e.g., signal SW4) to the first two-path switch 566 (e.g., from the memory controller 140) indicates a second value (e.g., a high value, a value represented by a logic '1'), the first two-path switch 566 may couple the Rb node 572 with the first switching component 562. The first two-path switch 566 may be an example of a switching component, a transistor, or a combination of multiple switching components and/or transistors configured to selectively couple a node to one of two different electrical paths. In some cases, a two-path switch may be configured to couple a node with any subset of selectable paths coupled with the two-path switch.

The second two-path switch 568 may be configured to selectively couple the reference capacitor 560 with either the voltage source 570 or with the reference node 530. For example, in some cases, if a command signal (e.g., signal SW5) to the second two-path switch 568 (e.g., from the memory controller 140) indicates a first value (e.g., a low value, a value represented by a logic '0'), the second two-path switch 568 may couple the reference capacitor 560 with the reference node 530. If a command signal (e.g., signal SW5) to the second two-path switch 568 (e.g., from the memory controller 140) indicates a second value (e.g., a high value, a value represented by a logic '1'), the second two-path switch 568 may couple the reference capacitor 560 with the voltage source 570. The second two-path switch 568 may be an example of a switching component, a transistor, or a combination of multiple switching components and/or transistors configured to selectively couple a node to one of two different electrical paths. In some cases, a two-path switch may be configured to couple a node with any subset of selectable paths coupled with the two-path switch.

During an access operation, a memory controller (e.g., memory controller 140) may coordinate the commands to the various switches (e.g., switching components 562, 564, 566, 568) to generate a reference signal during a second time period. The memory controller may also selectively couple the reference capacitor 560 to the reference node 530 during the access operation. The details of the operation of the reference signal circuit 508 are described in more detail with reference to FIG. 6, among other sections.

The plate line driving circuit 510 may be configured to drive the plate line 516 during an access operation of the memory cell 502. The value of the plate line 516 may be used to generate the state signal and the reference signal during an access operation. For example, the plate line driving circuit 510 may drive the plate line 516 high during a first time period to generate the state signal, and may drive the plate line 516 low during a second time period to generate the reference signal.

The plate line driving circuit 510 may include an inverter 580 driven by a plate driver signal 582 received from a memory controller (e.g., memory controller 140), a capacitor 584, a first switching component 586, and a second switching component 588.

The first switching component 586 may be configured to selectively couple the plate line 516 with the voltage source 536 based on a command signal (e.g., signal SW1) received from a memory controller (e.g., memory controller 140). The first switching component 586 may be an example of any type of switching component, transistor, or combination thereof that can selectively couple two electrical paths together.

The second switching component 588 may be configured to selectively couple the plate line 516 with ground 538 based on a command signal (e.g., signal SW0) received from a memory controller (e.g., memory controller 140). The second switching component 588 may be an example of any type of switching component, transistor, or combination thereof that can selectively couple two electrical paths together.

During an access operation, a memory controller (e.g., memory controller 140) may coordinate the commands to the various drivers (e.g., plate driver signal 582) and switches (e.g., switching components 586, 588) to generate a plate line signal during an access operation. The details of the operation of the plate line driving circuit 510 are described in more detail with reference to FIG. 6.

The memory circuit 500 may also include a switching component 590 that selectively couples the digit line 512 to the voltage source 536 during an access operation. The switching component 590 may be controlled by a command signal (e.g., signal SW2) received from a memory controller (e.g., memory controller 140).

Figure 6:
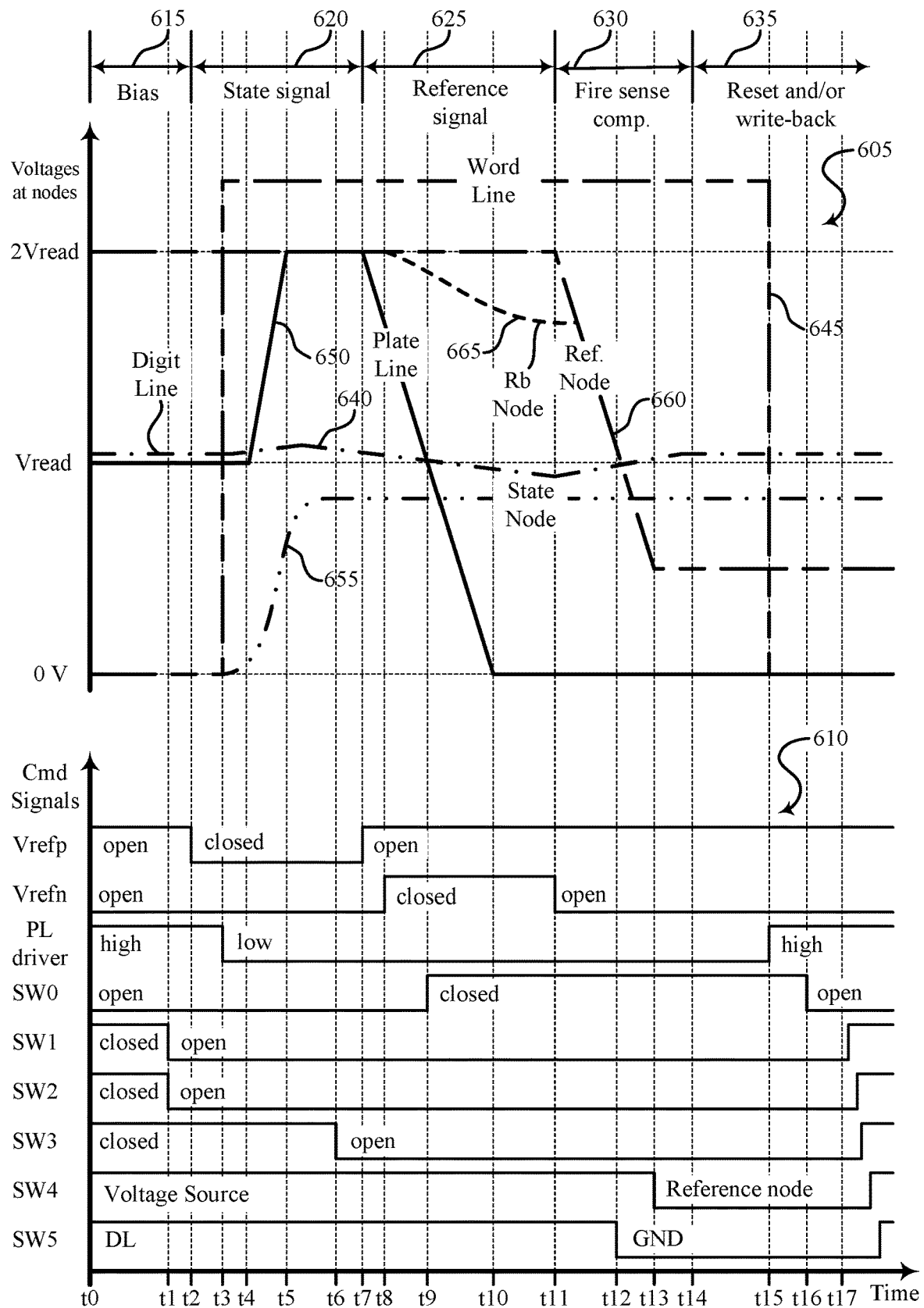
FIG. 6 illustrates an example of timing diagrams that support a self-referencing memory device in accordance with embodiments of the present disclosure.

FIG. 6 illustrates an example of timing diagrams 600 that support a self-referencing memory device in accordance with various embodiments of the present disclosure. The timing diagrams 600 include a first timing diagram 605 and a second timing diagram 610. The first timing diagram 605 shows voltage values at nodes in the memory circuit 500 described with reference to FIG. 5 during an access operation. The second timing diagram 610 shows logic values of command signals used in the memory circuit 500 during an access operation. The logic values shown in the second timing diagram 610 do not show specific voltage values and instead are exemplary. It should be appreciated that the specific voltage values associated with the command signals may be determined based on the characteristics of the component that receives and the command signal and the overall structure of the memory circuit 500.

The signals represented in the timing diagrams 600 correspond to components of the memory circuit 500 described with reference to FIG. 5. The digit line signal 640 may correspond to a signal on the digit line 512 during the access operation. The word line signal 645 may correspond to the word line signal 522. The plate line signal 650 may correspond to a signal on the plate line 516 during the access operation. The state signal 655 may correspond to a signal on the state node 526 during the access operation. The reference signal 660 may correspond to a signal on the reference node 530 during the access operation. The Rb node signal 665 may correspond to a signal on the Rb node 572 during the access operation. The command signals (e.g., Vrefp, Vrefn, PL driver, SW0, SW1, SW2, SW3, SW4, SW5) may correspond to various components indicated in the memory circuit 500 (e.g., switching components 552, 562, 564, 566, 568, 586, 588, 590 and plate line driving circuit 510).

It should be appreciated that if the components associated with the command signals or other aspects of the memory circuit 500 are modified, the corresponding command signals may also be modified. For example, if a switching component is modified to be a n-type transistor from a p-type transistor, a corresponding change in the command signal may also be implemented.

The timing diagrams 600 may represent a read operation executed by the memory circuit 500. The read operation may include a plurality of time periods. A bias time period 615 may be configured to prepare the memory cell 502 for the read operation. A state signal time period 620 may be configured to generate the state signal 655. A reference signal time period 625 may be configured to generate the reference signal 660. The fire sense component time period 630 may be configured to activate the sense component 504 and determine a logic state stored on the memory cell 502 based on the state signal 655 and the reference signal 660. The reset time period 635 may be configured to reset the memory cell 502 after the access operation is complete. In some cases, the reset time period 635 may also include a write-back operation (not shown) where the logic state read from the memory cell 502 is written back on the memory cell. Such may be the case because some read operations may destroy the logic state stored on the memory cell 502 (e.g., ferroelectric memory technology).

At time t0, the memory controller may determine to perform an access operation (e.g., a read operation) on the memory cell 502. At time t0, the memory cell 502 may be in a stable storage state based on the activations/deactivations of the various switches and switching components in the memory circuit 500. For example, the state signal circuit 506 and the reference signal circuit 508 may be isolated from the digit line 512 based on the switching components 552, 562 being in the open position at time t0. Other aspects of the memory circuit 500 may be determined based on the value of command signals at time t0, but are not discussed here. In another example, switching components 586, 590 may couple the plate line 516 and the digit line 512, respectively, to the voltage source 536 (e.g., Vmsa). In such examples, the digit line 512 and the plate line 516 may be biased to the same voltage level before the access operation begins (e.g., Vread). The offset between the digit line signal 640 and the plate line signal 650 is illustrated to make the signals easier to read.

During the bias time period 615, the reference capacitor 560 may be charged to a voltage level (e.g., 2Vread) higher than the voltage level of the digit line 512 and the plate line (e.g., Vread). To accomplish this switching components 564, 568 may be couple both plates of the reference capacitor 560 the voltage source 570.

At time t1, the memory controller may isolate the digit line 512 and the plate line 516 from the voltage source 536. The memory controller may modify signals SW1 and SW2 to open the switching components 586, 590 to accomplish the isolation.

At time t2, the memory controller may couple the state signal circuit 506 with the digit line 512. The memory controller may modify the Vrefp command signal to cause the switching component 552 to couple the state signal circuit 506 with the digit line 512. For example, because the switching component 552 may be a p-type transistor, the memory controller may modify the Vrefp signal to go from high to low. In some cases, the high value of the Vrefp command signal may be equal to 2Vmsa. In some cases, the low value of the Vrefp command signal may be equal to the voltage level of the digit line 512 (e.g., Vdl) minus the threshold voltage of the switching component 552 (e.g., Vth). Coupling the state signal circuit 506 with the digit line 512 may be the beginning of the state signal time period 620 of the access operation.

At time t3, the memory controller may couple the memory cell 502 with the digit line 512 and may begin biasing the plate line 516 to a higher voltage level. To couple the memory cell 502 with the digit line 512, the memory controller may send the word line signal 645 high (e.g., to a voltage level higher than 2Vread). Coupling the memory cell 502 to the digit line 512 may also cause perturbations to the digit line signal 640 around the voltage level Vread.

Coupling the memory cell 502 to the digit line 512 may also cause the state signal 655 to rise based on the charge stored on the cell capacitor 518 of the memory cell 502. Because both the memory cell 502 and the state signal circuit 506 are coupled to the digit line 512, the cell capacitor 518 may charge the charge capacitor 550 based on at least a portion of the charge stored on the cell capacitor 518. In this manner, the charge capacitor 550 may extract the logic state from the cell capacitor 518 and, thus, may store the logic state for other portions of the access operation. In the illustrative example, the state signal 655 settles in at a first value (e.g., greater than the reference signal 660). It should be appreciated that in other situations, the state signal 655 may settle in at a second value different from the first value (e.g., less than the reference signal 660).

The memory controller may also change the plate line driver command signal from high to low. When the plate line driver command signal goes low, the inverter 580 may transform the signal to be high. The capacitor 584 may begin to charge to a high value based on the high signal from the inverter 580. At time t4, the plate line signal 650 may begin to show the increase in voltage level (e.g., from Vread to 2Vread). At time t5, the plate line signal 650 may settle it at its higher bias level (e.g., 2Vread) based on the plate line driving command signal being low. At time t6, the memory controller may isolate the Rb node 372 of the reference signal circuit from the voltage source 370.

At time t7, the memory controller may isolate the state signal circuit 506 from the digit line 512. The memory controller may send the Vrefp signal high, thereby opening the switching component 552, which is a p-type transistor. In some cases, the state signal time period 620 may end at time t7. In other cases, the state signal time period 620 may at time t8.

The plate line signal 650 may begin to decrease from 2Vread to a different lower voltage level around time t7. When the state signal circuit 506 is isolated from the digit line 512, the plate line driving circuit 510 may still be connected to the digit line 512 through the memory cell 502. In some cases, because the digit line signal 640 is at or around Vread and the plate line signal 650 is at or around 2Vread, the plate line signal 650 may decrease based on being coupled with the digit line 512.

At time t8, the memory controller may couple the reference signal circuit 508 with the digit line 512. The memory controller may modify the Vrefn command signal to cause the switching component 562 to couple the reference signal circuit 508 with the digit line 512. For example, because the switching component 562 may be a n-type transistor, the memory controller may modify the Vrefn signal to go from low to high. In some cases, the low value of the Vrefn command signal may be equal to 0 volts. In some cases, the high value of the Vrefn command signal may be equal to the voltage level of the digit line 512 (e.g., Vdl) plus the threshold voltage of the switching component 562 (e.g., Vth). Coupling the reference signal circuit 508 with the digit line 512 may be the beginning of the reference signal time period 625 of the access operation.

At time t9, the memory controller may couple the plate line 516 with ground 538, thereby driving the plate line signal 650 even lower (e.g., to ground or zero volts). The memory controller may activate the second switching component 588 by sending the SW0 signal high thereby closing the circuit between the plate line 516 and ground 538.

At time t10, the plate line signal 650 may settle in at a voltage level that is less than the voltage level it was initialized to (e.g., zero volts is less than Vread). Sometime between time t8 and time t11, the reference capacitor 560 develops the reference signal 660 based on the memory cell 502. During the reference signal time period 625, the voltage level of the Rb node 572 may vary from the voltage level of the reference node 530.

At time t11, the memory controller may isolate the reference signal circuit 508 from the digit line 512. To isolate the reference signal circuit 508, the memory controller deactivate the switching component 562 by sending the Vrefn signal low. The reference signal time period 625 may end when the reference signal circuit 508 is isolated from the digit line 512. The reference signal 660 may begin decreasing at time t11 and settling into the stable reference signal value used to determine the logic state stored on the memory cell 502.

At time t12, the memory controller may couple the reference capacitor 560 with the reference node 530. To do this coupling, the memory controller may change the command signal SW5 from high to low. When the command signal SW5 is low, the second two-path switch 568 may couple the reference capacitor 560 with a different circuit (e.g., the reference node 530) than when the command signal SW5 is high (e.g., the voltage source 570).

At time t13, the memory controller may couple the reference capacitor 560 with ground 538. In this manner, the reference capacitor 560 may have one plate coupled to ground 538 and the other plate coupled to the reference node 530. To do this coupling, the memory controller may change the command signal SW4 from high to low. When the command signal SW4 is low, the first two-path switch 566 may couple the reference capacitor 560 (and/or the Rb node 572) with a different circuit (e.g., ground 538) than when the command signal SW5 is high (e.g., the switching component 562). In some cases, upon the reference capacitor 560 being grounded, the reference signal 660 may stabilize at a reference signal level that is usable for determining the logic state of the memory cell 502.

At time t14, the memory controller may fire the sense component 504 and determine the logic state stored on the memory cell 502 based on the state signal 655 and the reference signal 660. The sense component 504 may be activated at any time after t13. In such a manner, the exact timing of t14 may be altered based on implementations of the memory circuit 500.

At time t15, the memory controller may isolate the memory cell 502 from the digit line 512 and may send the plate line driver command signal high again. To isolate the memory cell 502, the memory controller may deactivate the selection component 520 by sending the word line signal 645 low (e.g., zero volts). At time t16, the memory controller may isolate the plate line 516 from ground 538.

At or after time t17, the memory controller may complete the access operation (e.g., read operation) and reset the various components to their resting state. In some cases, the memory controller may execute a write-back procedure after the sense component is activated (e.g., after time t14) to write-back the logic state value that was read to the memory cell 502. The write-back procedure is not depicted in the timing diagrams 600 of FIG. 6. Although various operations and related timing aspects are described with reference to FIG. 6, variations and other embodiments are contemplated and fall within the scope of the present disclosure.

Figure 7:
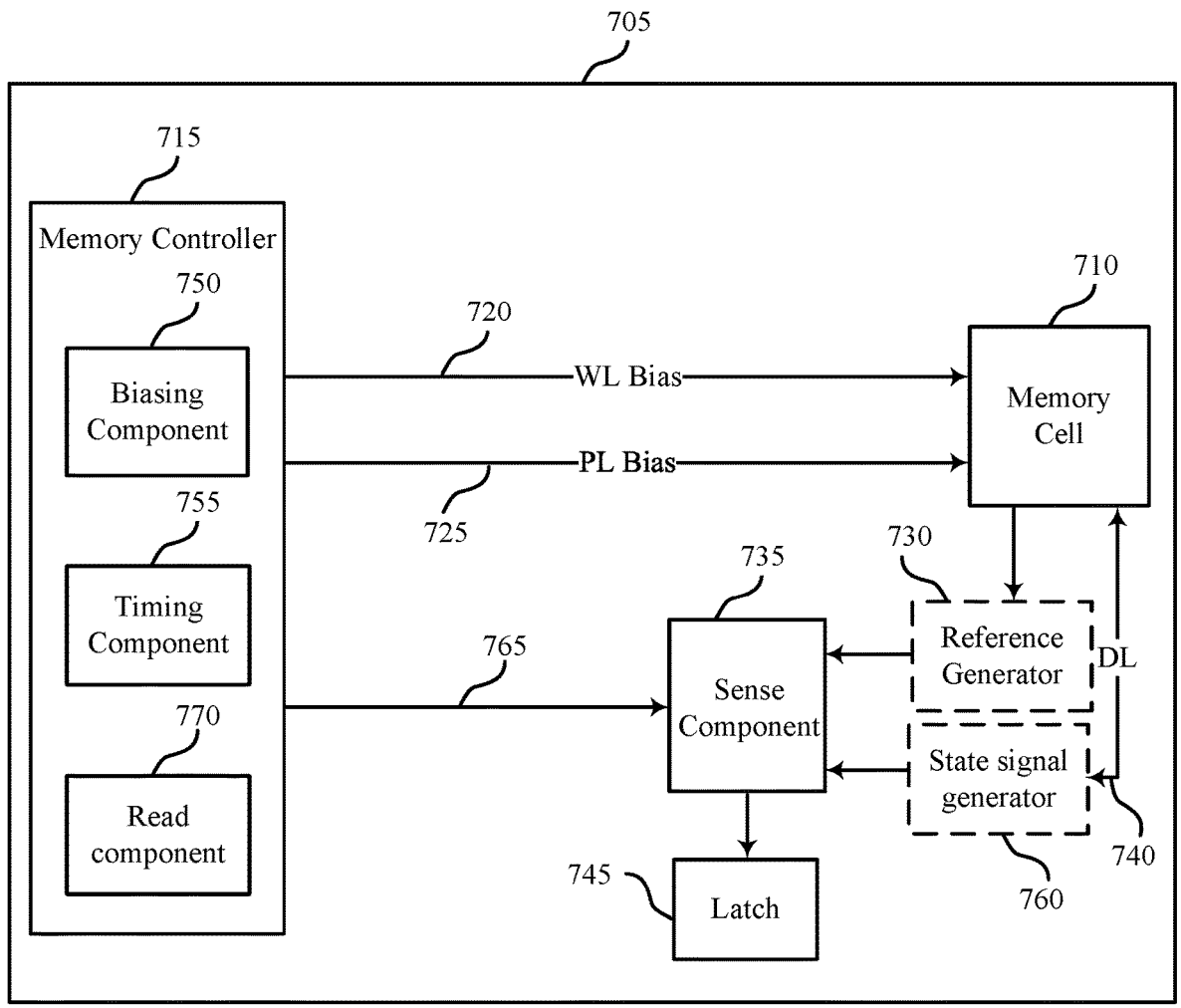
FIG. 7 shows a diagram of a memory device that supports a self-referencing memory device in accordance with embodiments of the present disclosure.

FIG. 7 shows a block diagram 700 of a memory device 705 that supports a self-referencing memory device in accordance with embodiments of the present disclosure. Memory device 705 may be referred to as an electronic memory apparatus, and may be an example of a component of a memory device 100 or a memory circuit 500 as described herein.

Memory device 705 may include one or more memory cells 710, a memory controller 715, a word line 720, a plate line 725, a reference generator 730, a sense component 735, a digit line 740, a latch 745, and a state signal generator 760. These components may be in electronic communication with each other and may perform one or more of the functions described herein. In some cases, memory controller 715 may include biasing component 750 and timing component 755. In some cases, sense component 735 may serve as the reference generator 730. In other cases, reference generator 730 may be optional.

Memory controller 715 may be in electronic communication with word line 720, digit line 740, sense component 735, and plate line 725, which may be examples of word line 110, digit line 115, sense component 125, and plate line 210 described with reference to FIGS. 1, and 2. Memory device 705 may also include reference generator 730, a state signal generator 760, and latch 745. The components of memory device 705 may be in electronic communication with each other and may perform aspects of the functions described with reference to FIGS. 1 through 6. In some cases, reference generator 730, state signal generator 760, sense component 735, and latch 745 may be components of memory controller 715.

In some examples, digit line 740 is in electronic communication with sense component 735 and a ferroelectric capacitor of ferroelectric memory cells 710. A ferroelectric memory cell 710 may be writable with a logic state (e.g., a first or second logic state). Word line 720 may be in electronic communication with memory controller 715 and a selection component of ferroelectric memory cell 710. Plate line 725 may be in electronic communication with memory controller 715 and a plate of the ferroelectric capacitor of ferroelectric memory cell 710. Sense component 735 may be in electronic communication with memory controller 715, digit line 740, latch 745, the reference generator 730, and/or the state signal generator 760. The reference generator 730 may be in electronic communication with memory cells 710 and/or memory controller 715. The state signal generator 760 may be in electronic communication with memory cells 710 and/or memory controller 715. Sense control line 765 may be couple the sense component 735 and the memory controller 715. These components may also be in electronic communication with other components, both inside and outside of memory device 705, in addition to components not listed above, via other components, connections, or buses.

Memory controller 715 may be configured to activate the word line 720, plate line 725, and/or digit line 740 by applying voltages to those various nodes. For example, biasing component 750 may be configured to apply a voltage to operate the memory cell 710 to read or write memory cell 710 as described above. In some cases, memory controller 715 may include a row decoder, column decoder, or both, as described herein. This may enable the memory controller 715 to access one or more memory cells 105. Biasing component 750 may also provide voltage to reference generator 730 in order to generate a reference signal for sense component 735. Additionally, biasing component 750 may provide voltage for the operation of sense component 735.

In some cases, memory controller 715 may perform its operations using timing component 755. For example, timing component 755 may control the timing of the various word line selections or plate biasing, including timing for switching and voltage application to perform the memory functions, such as reading and writing, discussed herein. In some cases, timing component 755 may control the operations of biasing component 750.

The reference generator 730 may include various components to generate a reference signal for sense component 735. The reference generate 730 may be an example of the reference signal circuit 508 described with references to FIGS. 5 and 6. The reference generator 730 may include circuitry configured to produce a reference signal. In some cases, reference generator 730 may be implemented using the selected ferroelectric memory cell or other ferroelectric memory cells 105. Sense component 735 may compare a signal from memory cell 710 (through digit line 740 and/or a state signal generator 760) with a reference signal from reference generator 730. Upon determining the logic state, the sense component may then store the output in latch 745, where it may be used in accordance with the operations of an electronic device that memory device 705 is a part. Sense component 735 may include a sense amplifier in electronic communication with the latch and the ferroelectric memory cell.

The state signal generator 760 may include various components to generate a state signal for the sense component 735. The state signal generator 760 may be an example of the state signal circuit 506 described with references to FIGS. 5 and 6. The state signal generator 760 may include circuitry configured to produce a state signal of one or more memory cells 710. In some cases, the state signal generator 760 may be implemented using the selected ferroelectric memory cell or other ferroelectric memory cells 105. Sense component 735 may compare a signal from memory cell 710 (through digit line 740 and/or a state signal generator 760) with a reference signal from reference generator 730. Upon determining the logic state, the sense component may then store the output in latch 745, where it may be used in accordance with the operations of an electronic device that memory device 705 is a part.

Read component 770 may be an example of aspects of the read component 815 described with reference to FIG. 8. The read component 770 and/or at least some of its various sub-components may be implemented in hardware, software executed by a processor, firmware, or any combination thereof. If implemented in software executed by a processor, the functions of the read component 770 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure. The read component 770 and/or at least some of its various sub-components may be physically located at various positions, including being distributed such that portions of functions are implemented at different physical locations by one or more physical devices. In some examples, read component 770 and/or at least some of its various sub-components may be a separate and distinct component in accordance with various embodiments of the present disclosure. In other examples, read component 770 and/or at least some of its various sub-components may be combined with one or more other hardware components, including but not limited to an I/O component, a transceiver, a network server, another computing device, one or more other components described in the present disclosure, or a combination thereof in accordance with various embodiments of the present disclosure.

Read component 770 may receive, by a state signal circuit coupled with a digit line, at least a portion of a charge stored on a ferroelectric capacitor based on a first signal on the digit line during a first time period of an access operation, generate, by a reference signal circuit coupled with the digit line, a reference signal based on a second signal on the digit line during a second time period of the access operation after the first time period, and determine a logic state of the ferroelectric capacitor based on a state signal indicative of the charge received by the state signal circuit and the reference signal. The read component 770 may also bias a plate line to a first voltage greater than a voltage level of a digit line during a first time period of an access operation to transfer at least a portion of a charge of a ferroelectric memory cell to a charge capacitor, bias the plate line to a second voltage less than the voltage level of the digit line during a second time period of the access operation to determine a reference signal based on a signal generated by the ferroelectric memory cell on the digit line, and determine a logic state of the ferroelectric memory cell based on the charge transferred to the charge capacitor and the reference signal.

Figure 8:
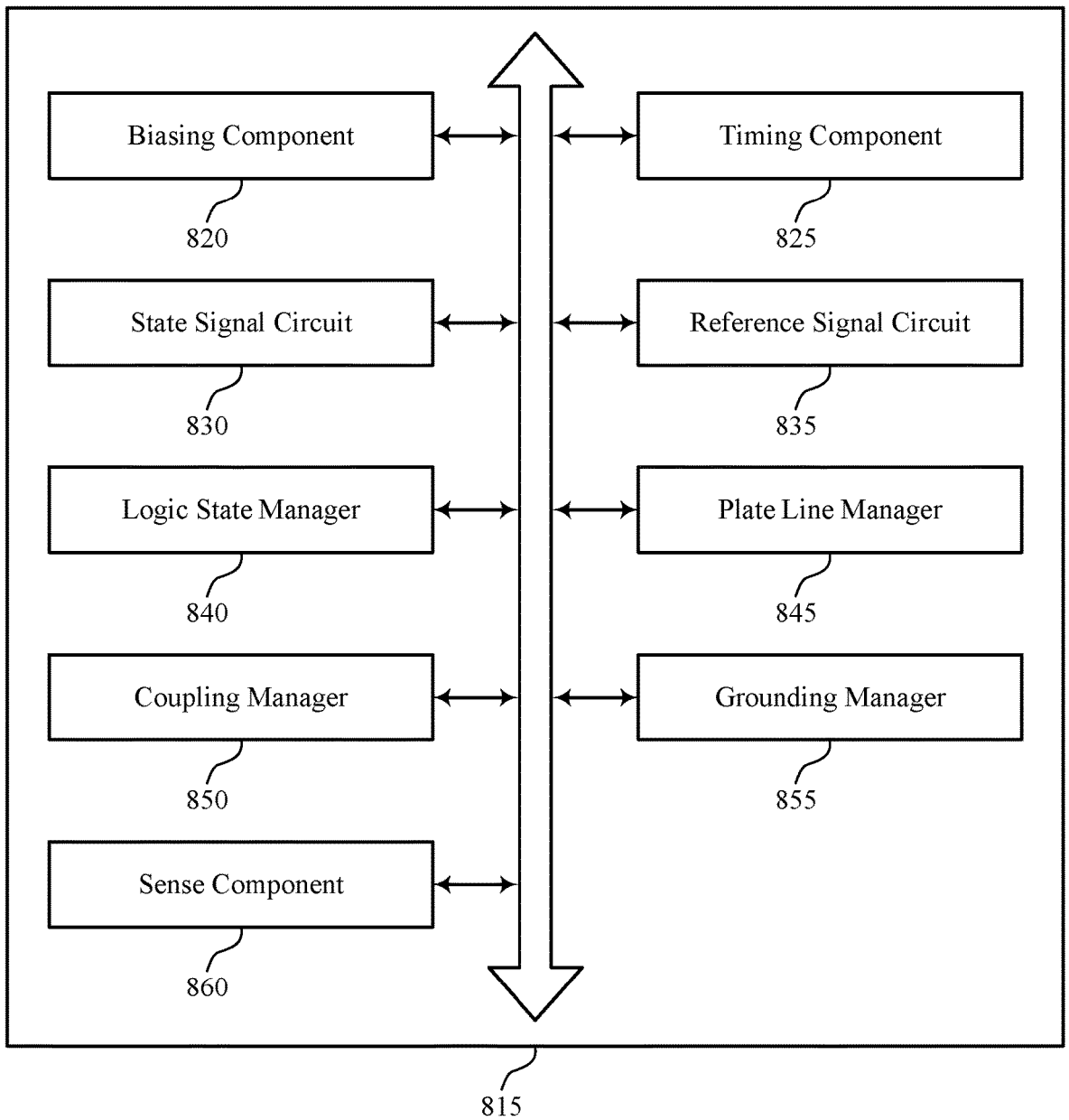
FIG. 8 shows a block diagram of a device that supports a self-referencing memory device in accordance with embodiments of the present disclosure.

FIG. 8 shows a block diagram 800 of a device 815 that supports a self-referencing memory device in accordance with embodiments of the present disclosure. In some examples, the device 815 may be an example of a read component 815. The read component 815 may be an example of aspects of a read component 770, 915 described with reference to FIGS. 7 and 9. The read component 815 may include biasing component 820, timing component 825, sense circuit 830, reference signal circuit 835, logic state manager 840, plate line manager 845, coupling manager 850, grounding manager 855, and sense component 860. Each of these modules may communicate, directly or indirectly, with one another (e.g., via one or more buses).

Sense circuit 830 may receive, by a state signal circuit coupled with a digit line, at least a portion of a charge stored on a ferroelectric capacitor based on a first signal on the digit line during a first time period of an access operation.

Reference signal circuit 835 may generate, by a reference signal circuit 835 coupled with the digit line, a reference signal based on a second signal on the digit line during a second time period of the access operation after the first time period.

Logic state manager 840 may determine a logic state of the ferroelectric capacitor based on a state signal indicative of the charge received by the state signal circuit and the reference signal and determine a logic state of the ferroelectric memory cell based on the charge transferred to the charge capacitor and the reference signal.

Plate line manager 845 may bias a plate line coupled with the ferroelectric capacitor to a first voltage level greater than a voltage level of the digit line during the first time period, where the first signal on the digit line is based on biasing the plate line. The plate line manager 845 may bias a plate line coupled with the ferroelectric capacitor to a second voltage level less than a voltage level of the digit line during the second time period, where the second signal on the digit line is based on biasing the plate line. The plate line manager 845 may bias a plate line to a first voltage greater than a voltage level of a digit line during a first time period of an access operation to transfer at least a portion of a charge of a ferroelectric memory cell to a charge capacitor. The plate line manager 845 may bias the plate line to a second voltage less than the voltage level of the digit line during a second time period of the access operation to determine a reference signal based on a signal generated by the ferroelectric memory cell on the digit line.

Coupling manager 850 may couple the state signal circuit to the digit line during the first time period by activating a cascode. The coupling manager 850 may isolate the state signal circuit from the digit line before generating the reference signal. The coupling manager 850 may couple the reference signal circuit to the digit line during the second time period by activating a cascode.

The coupling manager 850 may isolate the reference signal circuit from the digit line by de-activating a cascode. The coupling manager 850 may couple a first node of a reference capacitor of the reference signal circuit to a reference node of a sense component using a first switching component after the reference signal circuit is isolated from the digit line during the access operation, where determining the logic state is based on coupling the first node of the reference capacitor to the reference node. The coupling manager 850 may couple the ferroelectric capacitor to the digit line during the access operation, where the first time period and the second time period occur while the ferroelectric capacitor is coupled with the digit line. The coupling manager 850 may couple the charge capacitor to the digit line, where biasing the plate line to the first voltage occurs after coupling the charge capacitor to the digit line. The coupling manager 850 may couple a reference capacitor to the digit line while the plate line is biased to the second voltage. The coupling manager 850 may isolate the charge capacitor from the digit line before coupling the reference capacitor to the digit line.

Grounding manager 855 may ground a second node of the reference capacitor using a second switching component after the reference signal circuit is isolated from the digit line during the access operation, where determining the logic state is based on grounding the second node of the reference capacitor.

Sense component 860 may activate a sense component 860 to compare the state signal indicative of the charge received by the state signal circuit and the reference signal, where determining the logic state is based on the comparison.

Figure 9:
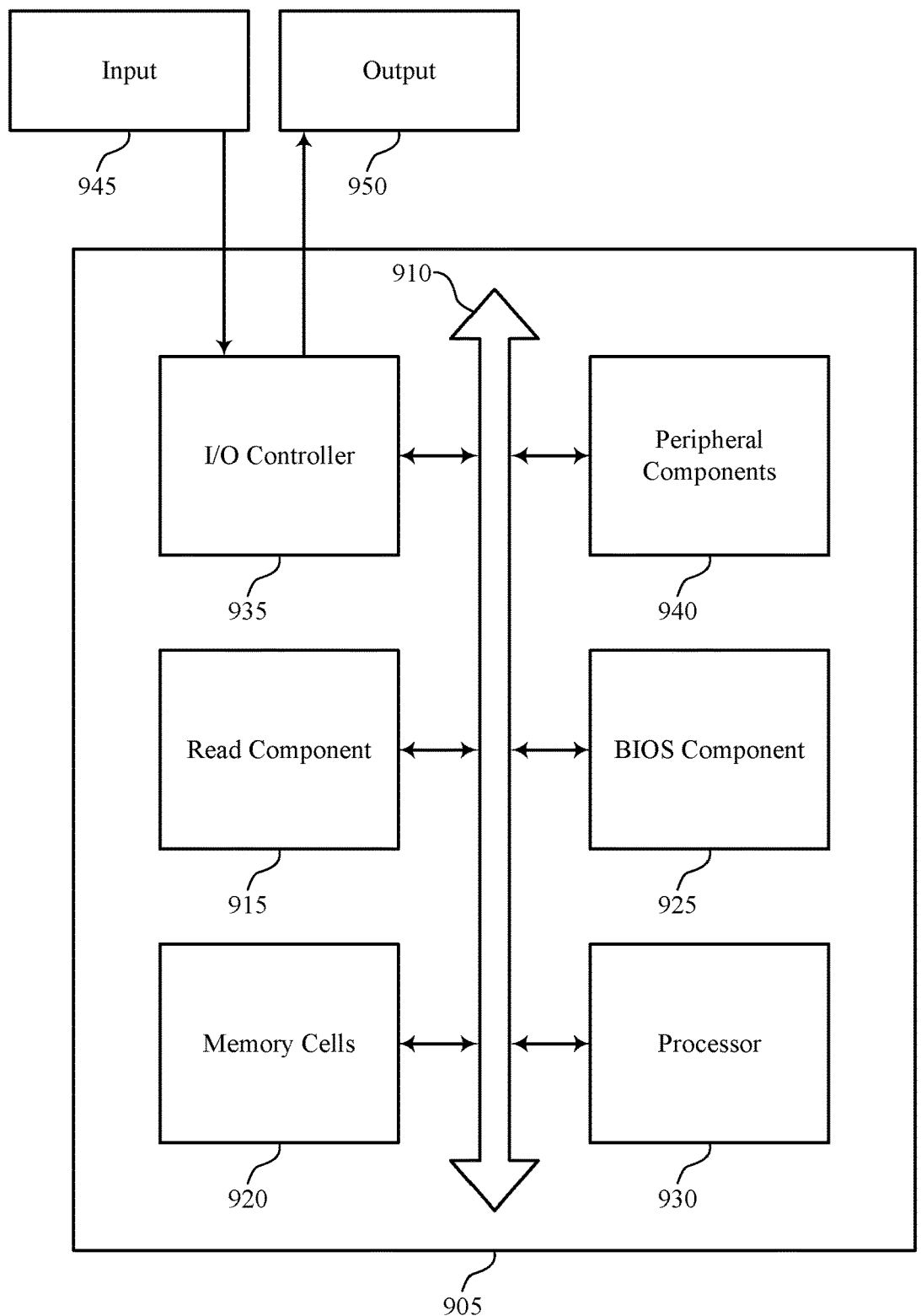
FIG. 9 illustrates a block diagram of a system including a memory device that supports a self-referencing memory device in accordance with embodiments of the present disclosure.

FIG. 9 shows a diagram of a system 900 including a device 905 that supports a self-referencing memory device in accordance with embodiments of the present disclosure. Device 905 may be an example of or include the components of memory device 100 or memory circuit 500 as described above, e.g., with reference to FIGS. 1 and 5-6. Device 905 may include components for bi-directional voice and data communications including components for transmitting and receiving communications, including read component 915, memory cells 920, basic input/output system (BIOS) component 925, processor 930, I/O controller 935, and peripheral components 940. These components may be in electronic communication via one or more buses (e.g., bus 910). Memory cells 920 may store information (i.e., in the form of a logical state) as described herein.

BIOS component 925 be a software component that includes BIOS operated as firmware, which may initialize and run various hardware components. BIOS component 925 may also manage data flow between a processor and various other components, e.g., peripheral components, input/output control component, etc. BIOS component 925 may include a program or software stored in read only memory, flash memory, or any other non-volatile memory.

Processor 930 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 930 may be configured to operate a memory device using a memory controller. In other cases, a memory controller may be integrated into processor 930. Processor 930 may be configured to execute computer-readable instructions stored in a memory to perform various functions (e.g., functions or tasks supporting a self-referencing memory device).

I/O controller 935 may manage input and output signals for device 905. I/O controller 935 may also manage peripherals not integrated into device 905. In some cases, I/O controller 935 may represent a physical connection or port to an external peripheral. In some cases, I/O controller 935 may utilize an operating system such as iOS®, ANDROID®, MS-DOS®, MS-WINDOWS®, OS/2®, UNIX®, LINUX®, or another known operating system. In other cases, I/O controller 935 may represent or interact with a modem, a keyboard, a mouse, a touchscreen, or a similar device. In some cases, I/O controller 935 may be implemented as part of a processor. In some cases, a user may interact with device 905 via I/O controller 935 or via hardware components controlled by I/O controller 935.

Peripheral components 940 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 945 may represent a device or signal external to device 905 that provides input to device 905 or its components. This may include a user interface or an interface with or between other devices. In some cases, input 945 may be managed by I/O controller 935, and may interact with device 905 via a peripheral component 940.

Output 950 may also represent a device or signal external to device 905 configured to receive output from device 905 or any of its components. Examples of output 950 may include a display, audio speakers, a printing device, another processor or printed circuit board, etc. In some cases, output 950 may be a peripheral element that interfaces with device 905 via peripheral component(s) 940. In some cases, output 950 may be managed by I/O controller 935

In one example, a memory device 905 or system 900 may include a ferroelectric memory cell storing a charge and coupled with a digit line, a state signal circuit selectively coupled with the digit line, the state signal circuit configured to extract at least a portion of the charge from the ferroelectric memory cell based on a first signal of the digit line, and a reference signal circuit selectively coupled with the digit line, the reference signal circuit configured to generate a reference signal based at least in part on a second signal of the digit line different from the first signal.

Some examples of the memory device 905 or system 900 described above may also include a sense component having a first node and a second node, the first node coupled with a node of the state signal circuit and the second node coupled with a node of the reference signal circuit. In some examples of the memory device 905 or system 900 described above, the state signal circuit includes a charge capacitor to store the charge extracted from the ferroelectric memory cell. Some examples of the memory device 905 or system 900 described above may also include a p-mos cascode that selectively couples the charge capacitor to the digit line during an access operation.

In some examples of the memory device 905 or system 900 described above, the reference signal circuit includes a reference capacitor having a capacitor value that may be greater than a capacitor value of a charge capacitor of the sense circuit. In some examples of the memory device 905 or system 900 described above, the capacitor value of the reference capacitor may be at least twice the capacitor value of the charge capacitor of the sense circuit. In some examples of the memory device 905 or system 900 described above, the reference signal circuit includes an n-mos cascode that selectively couples the reference capacitor to the digit line during an access operation.

In some examples of the memory device 905 or system 900 described above, the reference signal circuit includes a switching component that selectively couples the reference capacitor to a reference node of a sense component or to a voltage source during the access operation. In some examples of the memory device 905 or system 900 described above, the reference signal circuit includes a switching component to selectively couple the reference capacitor to the n-mos cascode during the access operation. Some examples of the memory device 905 or system 900 described above may also include a plate line driving circuit configured to bias a plate line to a plurality of voltages during an access operation. In some examples of the memory device 905 or system 900 described above, the plate line driving circuit includes a plurality of switching components to control a bias voltage of the plate line during the access operation.

The components of device 905 may include circuitry designed to carry out various functions. This may include various circuit elements, for example, conductive lines, transistors, capacitors, inductors, resistors, amplifiers, or other active or inactive elements, configured to carry out the functions described herein. Device 905 may be a computer, a server, a laptop computer, a notebook computer, a tablet computer, a mobile phone, a wearable electronic device, a personal electronic device, or the like. Or device 905 may be a portion or aspect of such a device.

Figure 10:
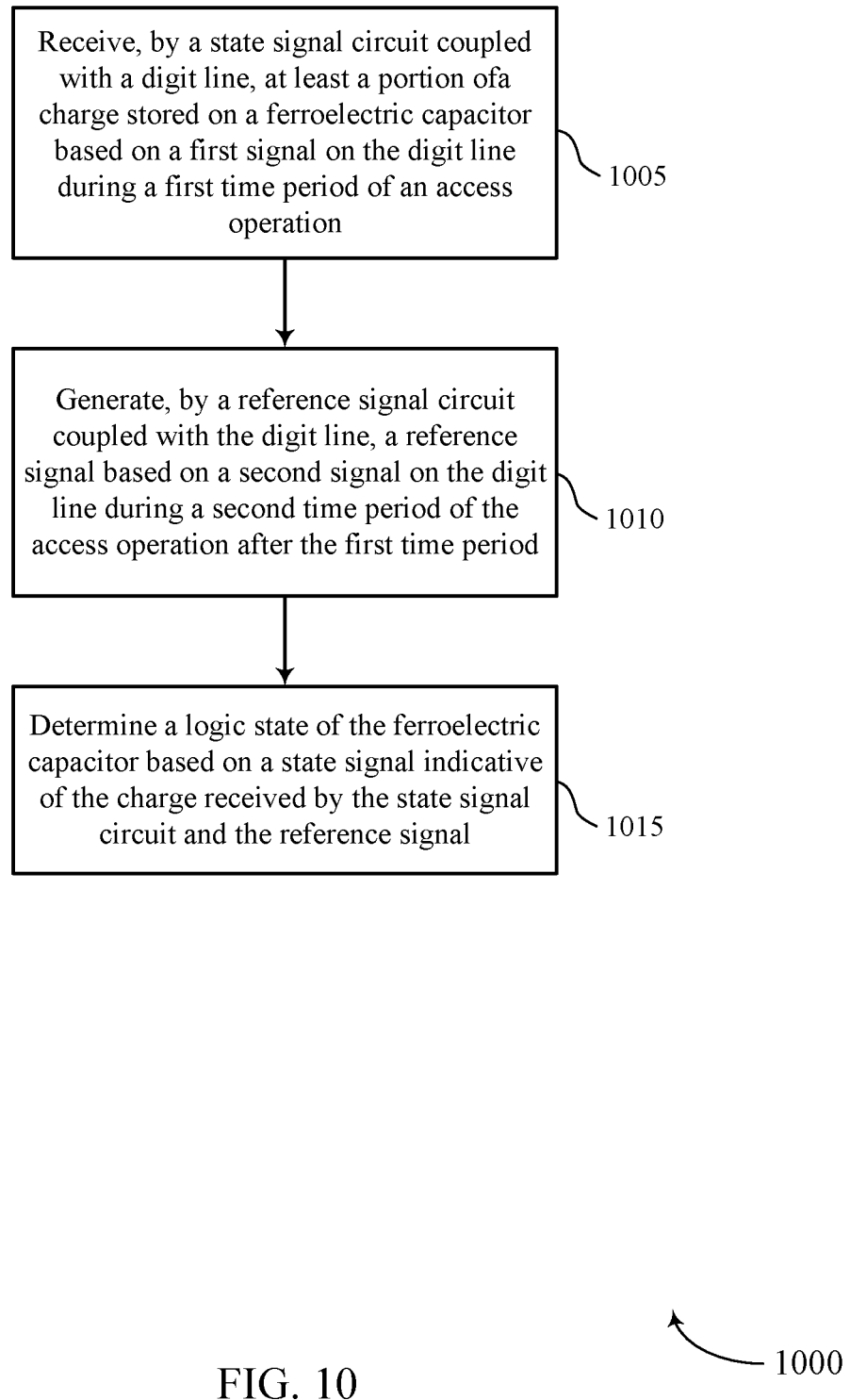
FIGS. 10 through 11 illustrate methods related to a self-referencing memory device in accordance with embodiments of the present disclosure.

FIG. 10 shows a flowchart illustrating a method 1000 for a self-referencing memory device in accordance with embodiments of the present disclosure. The operations of method 1000 may be implemented by a memory device 100 or memory circuit 500 or their components as described herein. For example, the operations of method 1000 may be performed by a read component as described with reference to FIGS. 7 through 9. In some examples, a memory device 100 or memory circuit 500 may execute a set of codes to control the functional elements of the device to perform the functions described below. Additionally or alternatively, the memory device 100 or memory circuit 500 may perform aspects of the functions described below using special-purpose hardware.

At block 1005 the memory device 100 or memory circuit 500 may receive, by a state signal circuit coupled with a digit line, at least a portion of a charge stored on a ferroelectric capacitor based on a first signal on the digit line during a first time period of an access operation. The operations of block 1005 may be performed according to the methods described herein. In certain examples, aspects of the operations of block 1005 may be performed by a sense circuit as described with reference to FIGS. 7 through 9.

At block 1010 the memory device 100 or memory circuit 500 may generate, by a reference signal circuit coupled with the digit line, a reference signal based on a second signal on the digit line during a second time period of the access operation after the first time period. The operations of block 1010 may be performed according to the methods described herein. In certain examples, aspects of the operations of block 1010 may be performed by a reference signal circuit as described with reference to FIGS. 7 through 9.

At block 1015 the memory device 100 or memory circuit 500 may determine a logic state of the ferroelectric capacitor based at least in part on a state signal indicative of the charge received by the state signal circuit and the reference signal. The operations of block 1015 may be performed according to the methods described herein. In certain examples, aspects of the operations of block 1015 may be performed by a logic state manager as described with reference to FIGS. 7 through 9.

The apparatus for performing the method 1000 may include means for receiving, by a state signal circuit coupled with a digit line, at least a portion of a charge stored on a ferroelectric capacitor based on a first signal on the digit line during a first time period of an access operation, means for generating, by a reference signal circuit coupled with the digit line, a reference signal based on a second signal on the digit line during a second time period of the access operation after the first time period, and means for determining a logic state of the ferroelectric capacitor based at least in part on a state signal indicative of the charge received by the state signal circuit and the reference signal.

Another apparatus for performing the method 1000 may include a memory cell and a memory controller in electronic communication with the memory cell, wherein the memory cell is operable to receive, by a state signal circuit coupled with a digit line, at least a portion of a charge stored on a ferroelectric capacitor based on a first signal on the digit line during a first time period of an access operation, generate, by a reference signal circuit coupled with the digit line, a reference signal based on a second signal on the digit line during a second time period of the access operation after the first time period, and determine a logic state of the ferroelectric capacitor based at least in part on a state signal indicative of the charge received by the state signal circuit and the reference signal.

Some examples of the method 1000 and the apparatus described above may further include processes, features, means, or instructions for coupling the state signal circuit to the digit line during the first time period by activating a cascode.

Some examples of the method 1000 and the apparatus described above may further include processes, features, means, or instructions for biasing a plate line coupled with the ferroelectric capacitor to a first voltage level greater than a voltage level of the digit line during the first time period, wherein the first signal on the digit line may be based at least in part on biasing the plate line.

Some examples of the method 1000 and the apparatus described above may further include processes, features, means, or instructions for isolating the state signal circuit from the digit line before generating the reference signal.

Some examples of the method 1000 and the apparatus described above may further include processes, features, means, or instructions for biasing a plate line coupled with the ferroelectric capacitor to a second voltage level less than a voltage level of the digit line during the second time period, wherein the second signal on the digit line may be based at least in part on biasing the plate line.

Some examples of the method 1000 and the apparatus described above may further include processes, features, means, or instructions for coupling the reference signal circuit to the digit line during the second time period by activating a cascode.

Some examples of the method 1000 and the apparatus described above may further include processes, features, means, or instructions for isolating the reference signal circuit from the digit line by de-activating a cascode.

Some examples of the method 1000 and the apparatus described above may further include processes, features, means, or instructions for coupling a first node of a reference capacitor of the reference signal circuit to a reference node of a sense component using a first switching component after the reference signal circuit may be isolated from the digit line during the access operation, wherein determining the logic state may be based at least in part on coupling the first node of the reference capacitor to the reference node.

Some examples of the method 1000 and the apparatus described above may further include processes, features, means, or instructions for grounding a second node of the reference capacitor using a second switching component after the reference signal circuit may be isolated from the digit line during the access operation, wherein determining the logic state may be based at least in part on grounding the second node of the reference capacitor.

Some examples of the method 1000 and the apparatus described above may further include processes, features, means, or instructions for activating a sense component to compare the state signal indicative of the charge received by the state signal circuit and the reference signal, wherein determining the logic state may be based at least in part on the comparison.

Some examples of the method 1000 and the apparatus described above may further include processes, features, means, or instructions for coupling the ferroelectric capacitor to the digit line during the access operation, wherein the first time period and the second time period occur while the ferroelectric capacitor may be coupled with the digit line.

Figure 11:
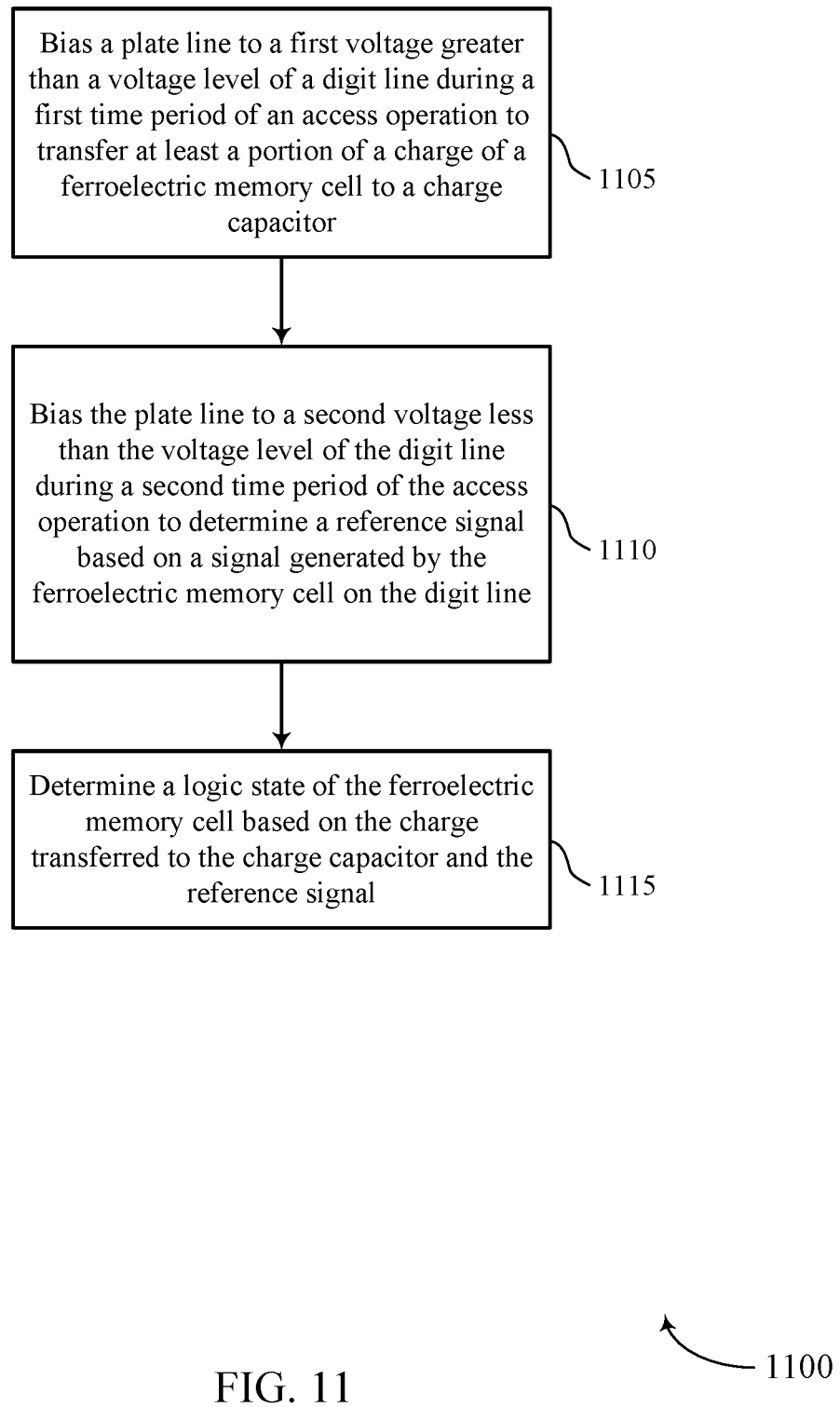

FIG. 11 shows a flowchart illustrating a method 1100 for a self-referencing memory device in accordance with embodiments of the present disclosure. The operations of method 1100 may be implemented by a memory device 100 or memory circuit 500 or their components as described herein. For example, the operations of method 1100 may be performed by a read component as described with reference to FIGS. 7 through 9. In some examples, a memory device 100 or memory circuit 500 may execute a set of codes to control the functional elements of the device to perform the functions described below. Additionally or alternatively, the memory device 100 or memory circuit 500 may perform aspects of the functions described below using special-purpose hardware.

At block 1105 the memory device 100 or memory circuit 500 may bias a plate line to a first voltage greater than a voltage level of a digit line during a first time period of an access operation to transfer at least a portion of a charge of a ferroelectric memory cell to a charge capacitor. The operations of block 1105 may be performed according to the methods described herein. In certain examples, aspects of the operations of block 1105 may be performed by a plate line manager as described with reference to FIGS. 7 through 9.

At block 1110 the memory device 100 or memory circuit 500 may bias the plate line to a second voltage less than the voltage level of the digit line during a second time period of the access operation to determine a reference signal based at least in part on a signal generated by the ferroelectric memory cell on the digit line. The operations of block 1110 may be performed according to the methods described herein. In certain examples, aspects of the operations of block 1110 may be performed by a plate line manager as described with reference to FIGS. 7 through 9.

At block 1115 the memory device 100 or memory circuit 500 may determine a logic state of the ferroelectric memory cell based at least in part on the charge transferred to the charge capacitor and the reference signal. The operations of block 1115 may be performed according to the methods described herein. In certain examples, aspects of the operations of block 1115 may be performed by a logic state manager as described with reference to FIGS. 7 through 9.

An apparatus for performing the method 1100 may include means for biasing a plate line to a first voltage greater than a voltage level of a digit line during a first time period of an access operation to transfer at least a portion of a charge of a ferroelectric memory cell to a charge capacitor, means for biasing the plate line to a second voltage less than the voltage level of the digit line during a second time period of the access operation to determine a reference signal based at least in part on a signal generated by the ferroelectric memory cell on the digit line, and means for determining a logic state of the ferroelectric memory cell based at least in part on the charge transferred to the charge capacitor and the reference signal.

Another apparatus for performing the method 1100 may include a memory cell and a memory controller in electronic communication with the memory cell, wherein the memory cell is operable to bias a plate line to a first voltage greater than a voltage level of a digit line during a first time period of an access operation to transfer at least a portion of a charge of a ferroelectric memory cell to a charge capacitor, bias the plate line to a second voltage less than the voltage level of the digit line during a second time period of the access operation to determine a reference signal based at least in part on a signal generated by the ferroelectric memory cell on the digit line, and determine a logic state of the ferroelectric memory cell based at least in part on the charge transferred to the charge capacitor and the reference signal.

Some examples of the method 1100 and the apparatus described above may further include processes, features, means, or instructions for coupling the charge capacitor to the digit line, wherein biasing the plate line to the first voltage occurs after coupling the charge capacitor to the digit line.

Some examples of the method 1100 and the apparatus described above may further include processes, features, means, or instructions for coupling a reference capacitor to the digit line while the plate line may be biased to the second voltage.

Some examples of the method 1100 and the apparatus described above may further include processes, features, means, or instructions for isolating the charge capacitor from the digit line before coupling the reference capacitor to the digit line.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

As used herein, the term "substantially" means that the modified characteristic (e.g., a verb or adjective modified by the term substantially) need not be absolute but is close enough so as to achieve the advantages of the characteristic.

The term "isolated" refers to a relationship between components in which electrons are not presently capable of flowing between them; components are isolated from each other if there is an open circuit between them. For example, two components physically connected by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein, including memory device 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
biasing, during a first time period of an access operation, a plate line to a first voltage greater than a non-zero voltage level of a digit line to transfer at least a portion of a charge of a ferroelectric memory cell to a charge capacitor;
biasing, during a second time period of the access operation, the plate line to a ground voltage less than the non-zero voltage level of the digit line to determine, while the plate line is biased to the ground voltage that is less than the non-zero voltage level of the digit line, a reference signal based at least in part on a signal generated by the ferroelectric memory cell on the digit line; and
determining a logic state of the ferroelectric memory cell based at least in part on the charge transferred to the charge capacitor and the reference signal.

2. The method of claim 1, further comprising:
coupling the charge capacitor to the digit line, wherein biasing the plate line to the first voltage occurs after coupling the charge capacitor to the digit line.

3. The method of claim 1, further comprising:
coupling a reference capacitor to the digit line while the plate line is biased to the ground voltage.

4. The method of claim 3, further comprising:
isolating the charge capacitor from the digit line prior to coupling the reference capacitor with the digit line.

5. The method of claim 3, further comprising:
adjusting a voltage across the reference capacitor based at least in part on coupling the reference capacitor with the digit line, wherein determining the reference signal is based at least in part on adjusting the voltage across the reference capacitor.

6. The method of claim 1, further comprising:
coupling a node of a reference capacitor with a sensing component after biasing the plate line to the ground voltage, wherein the determining the logic state of the ferroelectric memory cell is based at least in part on coupling the node of the reference capacitor to the sensing component.

7. The method of claim 6, further comprising:
coupling a second node of the reference capacitor with the ground voltage after coupling the node of the reference capacitor to the sensing component.

8. The method of claim 1, further comprising:
coupling the ferroelectric memory cell with the digit line, wherein transferring at least the portion of the charge of the ferroelectric memory cell to the charge capacitor is based at least in part on coupling the ferroelectric memory cell with the digit line and coupling the charge capacitor to the digit line.

9. A method, comprising:
biasing, during a third access period of an access operation, a plate line and a digit line to a third voltage less than a first voltage, wherein the third access period occurs prior to a first time period;
charging, during the third access period of the access operation, a reference capacitor to the first voltage;
biasing, during the first time period of the access operation, the plate line to the first voltage greater than a voltage level of the digit line to transfer at least a portion of a charge of a ferroelectric memory cell to a charge capacitor;
biasing, during a second time period of the access operation, the plate line to a ground voltage less than the voltage level of the digit line to determine a reference signal based at least in part on a signal generated by the ferroelectric memory cell on the digit line; and
determining a logic state of the ferroelectric memory cell based at least in part on the charge transferred to the charge capacitor and the reference signal.

10. An apparatus, comprising:
a ferroelectric memory cell for storing a charge and coupled with a plate line;
a plate line driver configured to bias the plate line to a first voltage greater than a non-zero voltage level of a digit line coupled with the ferroelectric memory cell;
a charge capacitor selectively couplable with the ferroelectric memory cell and configured to transfer at least a portion of the charge stored on the ferroelectric memory cell while the plate line is biased to the first voltage;
a switching component configured to bias the plate line to a ground voltage less than the non-zero voltage level of the digit line to determine, while the plate line is biased to the ground voltage that is less than the non-zero voltage level of the digit line, a reference signal based at least in part on a signal generated by the ferroelectric memory cell on the digit line; and
a sense component coupled with the charge capacitor and configured to determine a logic state of the ferroelectric memory cell based at least in part on the charge transferred to the charge capacitor and the reference signal.

11. The apparatus of claim 10, wherein the switching component is further configured to bias the plate line to the ground voltage after biasing the plate line to the first voltage.

12. The apparatus of claim 10, further comprising:
a second switching component configured to isolate the charge capacitor from the digit line after the charge of the ferroelectric memory cell is transferred to the charge capacitor, wherein determining the logic state of the ferroelectric memory cell is based at least in part on isolating the charge capacitor from the digit line.

13. The apparatus of claim 10, further comprising:
a reference capacitor comprising a first node and a second node, wherein the reference capacitor is selectively couplable with the digit line by the first node and the sense component by the second node, wherein the reference signal is based at least in part on a voltage across the reference capacitor.

14. The apparatus of claim 13, further comprising:
a second switching component configured to couple the first node of the reference capacitor with the digit line or isolate the first node of the reference capacitor from the digit line.

15. The apparatus of claim 14, wherein the second switching component couples the first node of the reference capacitor with the digit line after the charge of the ferroelectric memory cell is transferred to the charge capacitor.

16. The apparatus of claim 13, further comprising:
a second switching component configured to couple the first node of the reference capacitor with the ground voltage while the reference capacitor is isolated from the digit line.

17. An apparatus, comprising:
a ferroelectric memory cell for storing a charge and coupled with a plate line;
a plate line driver configured to bias the plate line to a first voltage greater than a voltage level of a digit line coupled with the ferroelectric memory cell;
a charge capacitor selectively couplable with the ferroelectric memory cell and configured to transfer at least a portion of the charge stored on the ferroelectric memory cell while the plate line is biased to the first voltage;
a sense component coupled with the charge capacitor and configured to determine a logic state of the ferroelectric memory cell based at least in part on the charge transferred to the charge capacitor and a reference signal; and
a reference capacitor comprising a first node and a second node, wherein the reference capacitor is selectively couplable with the digit line by the first node and the sense component by the second node, wherein the reference signal is based at least in part on a voltage across the reference capacitor, wherein a first capacitor value of the reference capacitor is at least twice a second capacitor value of the charge capacitor.

18. An apparatus, comprising:
a plate line coupled with a ferroelectric memory cell;
a charge capacitor coupled with the ferroelectric memory cell; and
a controller coupled with the plate line and the charge capacitor, wherein the controller is operable to:
bias, during a first time period of an access operation, the plate line to a first voltage greater than a non-zero voltage level of a digit line to transfer at least a portion of a charge of the ferroelectric memory cell to the charge capacitor;

bias, during a second time period of the access operation, the plate line to a ground voltage less than the non-zero voltage level of the digit line to determine, while the plate line is biased to the ground voltage that is less than the non-zero voltage level of the digit line, a reference signal based at least in part on a signal generated by the ferroelectric memory cell on the digit line; and determine a logic state of the ferroelectric memory cell based at least in part on the charge transferred to the charge capacitor and the reference signal.

19. The apparatus of claim 18, wherein the controller is further operable to:

couple the charge capacitor with the digit line, wherein biasing the plate line to the first voltage occurs after coupling the charge capacitor to the digit line.

20. The apparatus of claim 18, wherein the controller is further operable to:

couple a reference capacitor with the digit line while the plate line is biased to the ground voltage.

* * * * *